US012688341B1

(12) United States Patent
Ho et al.

(10) Patent No.: US 12,688,341 B1
(45) Date of Patent: Jul. 21, 2026

(54) TRAINING A SIMULATION-TO-REAL MODEL, BASED ON PERCEPTION LOSSES, TO MITIGATE REALITY GAP IN ROBOTICS AND/OR OTHER APPLICATIONS

(71) Applicant: GDM Holding LLC, Mountain View, CA (US)

(72) Inventors: Daniel Ho, Fremont, CA (US); Yunfei Bai, Fremont, CA (US); Kanishka Rao, Santa Clara, CA (US)

(73) Assignee: GDM Holding LLC, Mountain View, CA (US)

( * ) Notice: Subject to any disclaimer, the term of this patent is extended or adjusted under 35 U.S.C. 154(b) by 817 days.

(21) Appl. No.: 15/929,471

(22) Filed: May 4, 2020

(51) Int. Cl.
| | |
|---|---|
| *G06F 30/27* | (2020.01) |
| *B25J 9/16* | (2006.01) |
| *G06N 3/045* | (2023.01) |
| *G06N 3/084* | (2023.01) |
| *G06N 20/20* | (2019.01) |
| *G06V 10/75* | (2022.01) |

(52) U.S. Cl.
CPC .............. *G06F 30/27* (2020.01); *B25J 9/163* (2013.01); *B25J 9/1671* (2013.01); *G06N 3/045* (2023.01); *G06N 3/084* (2013.01); *G06N 20/20* (2019.01); *G06V 10/757* (2022.01)

(58) Field of Classification Search
CPC ...... G06F 30/27; B25J 9/1671; G06V 10/757; G06T 5/005; G06T 11/008
See application file for complete search history.

(56) References Cited

U.S. PATENT DOCUMENTS

| | | | | |
|---|---|---|---|---|
| 10,235,601 | B1 * | 3/2019 | Wrenninge | .......... G06K 9/6256 |
| 10,769,766 | B1 * | 9/2020 | Padfield | .............. G06K 9/6259 |
| 2018/0349527 | A1 * | 12/2018 | Li | ............................ G06N 3/08 |

(Continued)

OTHER PUBLICATIONS

'Using Simulation and Domain Adaptation to Improve Efficiency of Deep Robotic Grasping' Bousmalis, 2017, arxiv:1709.07857v2.*

(Continued)

*Primary Examiner* — Imad Kassim
(74) *Attorney, Agent, or Firm* — Gray Ice Higdon

(57) ABSTRACT

Implementations disclosed herein relate to mitigating the reality gap through training a simulation-to-real machine learning model ("Sim2Real" model) based on loss(es) generated using already trained perception model(s), such as perception model(s) trained to process an image and generate predicted output(s) (e.g., predicted bounding area(s) and/or predicted classification(s) for object(s) in a given image). In some implementations, the perception model(s) can be trained to generate predicted output(s) based on processing real image(s), and can be used to process a predicted real image to generate the predicted output(s). The predicted output(s) can be compared to ground truth output(s), from the simulator, to generate a perception loss. The Sim2Real model can be updated based on the generated perception loss. In various implementations, the Sim2Real model can additionally and/or alternatively be updated based on additional loss(es). Once updated, the Sim2Real model can be utilized in generating robotic control policies to control a real robot.

20 Claims, 12 Drawing Sheets

(56) References Cited

U.S. PATENT DOCUMENTS

| 2019/0147582 | A1* | 5/2019 | Lee | G06T 5/005 |
| | | | | 382/156 |
| 2019/0171223 | A1* | 6/2019 | Liang | G06T 3/0012 |
| 2021/0107157 | A1* | 4/2021 | Bai | B25J 9/1692 |
| 2021/0334976 | A1* | 10/2021 | Lee | G06T 7/11 |
| 2022/0269279 | A1* | 8/2022 | Redford | G06N 3/045 |

OTHER PUBLICATIONS

'Unsupervised Pixel-Level Domain Adaptation with Generative Adversarial Networks' Bousmalis, 2016, arxiv:1612.05424v1.*
'Learning from simulated and unsupervised images through adversarial training' Shrivastava, 2017, computer vision foundation.*
'Paired cycle-GAN-based image correction for quantitative cone-beam computedtomography' Medical Physics / vol. 46, Issue 9 / p. 3998-4009 (Year: 2019).*
Peng et al. ("Sim-to-Real Transfer of Robotic Control with Dynamics Randomization", May 21-25, 2018 IEEE) (Year: 2018).*
Bohg et al. "Data-Driven Grasp Synthesis—A Survey." IEEE Transactions on Robotics, vol. 30, Issue 2; 21 pages; Apr. 2014.
Bousmalis, K. et al., "Using Simulation and Domain Adaptation to Improve Efficiency of Deep Robotic Grasping;" 2018 IEEE International Conference on Robotics and Automation (ICRA); 9 pages.
Chavan-Dafle, N. et al., "Stable Prehensile Pushing: In-Hand Manipulation with Alternating Sticking Contacts;" IEEE International Conference on Robotics and Automation (ICRA); 8 pages; 2018.
Fujimoto, Scott et al.; "Addressing Function Approximation Error in Actor-Critic Methods;" Cornell University, arXiv.org, arXiv:1802.09477; 15 pages; dated Oct. 22, 2018.
Ganin, Y., et al.; Domain-Adversarial Training of Neural Networks; Journal of Machine Learning Research; vol. 17, No. 59; pp. 1-35; dated 2016.
Gopalan, R., et al.; Domain Adaptation for Object Recognition: An Unsupervised Approach; ICCV; 8 pages; dated 2011.
Kingma et al. "Adam: A Method for Stochastic Optimization;" Cornell University, arXiv.org, arXiv:1412.6980; 9 pages; 2014.
Mahler J., et al.; Dex-Net 2.0: Deep Learning to Plan Robust Grasps with Synthetic Point Clouds and Analytic Grasp Metrics; 12 Pages; dated 2017.
Zeng, A. et al., "Learning Synergies between Pushing and Grasping with Self-supervised Deep Reinforcement Learning;" Cornell University, arXiv.org, arXiv:1803.09956; 9 pages; 2018.
Almahairi, A. et al., Augmented CycleGAN: Learning Many-To-Many Mappings From Unpaired Data; Cornell University, arXiv. org, arXiv:1802.10151v1; 10 pages; Feb. 27, 2018.
Bousmalis, K. et al., "Unsupervised Pixel-Level Domain Adaptation With Generative Adversarial Networks;" 2017 IEEE Conference on Computer Vision and Pattern Recognition (CVPR); 15 pages; 2016.
Brock, A. et al., "Large Scale GAN Training For High Fidelity Natural Image Synthesis;" Cornell University, arXiv.org, arXiv:1809.11096v1; 29 pages; Sep. 28, 2018.
Caseiro, R. et al., "Beyond The Shortest Path: Unsupervised Domain Adaptation by Sampling Subspaces Along the Spline Flow;" In Proceedings of the IEEE Conference on Computer Vision and Pattern Recognition; pp. 3846-3854; 2015.
Chu, C. et al., "CycleGAN, a Master of Steganography;" Cornell University, arXiv.org, arXiv:1712.02950v2; 6 pages; Dec. 16, 2017.
Francis, A. et al., "Long-Range Indoor Navigation With PRM-RL;" Cornell University, arXiv.org, arXiv:1902.09458v1; 19 pages; Feb. 25, 2019.

Goodfellow, I. et al. "Generative Adversarial Networks;" Cornell University, arXiv.org, arXiv:1406.2661; 9 pages; Jun. 10, 2014.
Hoffman, J. et al., "cyCADA: Cycle-Consistent Adversarial Domain Adaptation;" Cornell University, arXiv.org, arXiv:1711.03213v3; 15 pages; Dec. 29, 2017.
Hua, X. et al., "Unsupervised Cross-Domain Image Generation;" http://cs229.stanford.edu/proj2017/final-reports/5241608.pdf; 6 pages; 2017.
James, S. et al., "Task-Embedded Control Networks for Few-Shot Imitation Learning;" Cornell University, arXiv.org, arXiv:1810.03237v1; 13 pages; Oct. 8, 2018.
James, S. et al., "Transferring End-To-End Visuomotor Control From Simulation to Real World for a Multi-Stage Task;" Cornell University, arXiv.org, arXiv:1707.02267;10 pages; Oct. 17, 2017.
James, S. et al. "Sim-To-Real via Sim-To-Sim: Data-Efficient Robotic Grasping via Randomized-To-Canonical Adaptation Networks;" In Computer Vision and Pattern Recognition (CVPR); 14 pages; 2018.
Kalashnikov, D. et al., "Scalable Deep Reinforcement Learning for Vision-Based Robotic Manipulation;" Proceedings of the 2nd Conference on Robot Learning; 23 pages; 2018.
Lenz, I. et al., "Deep Learning for Detecting Robotic Grasps;" International Journal on Robotics Research; 17 pages, 2013.
Long et al., "Learning Transferable Features With Deep Adaptation Networks;" Cornell University, arXiv.org, arXiv:1502.02791v2; 9 pages; May 27, 2015.
Matas, J et al., Sim-To-Real Reinforcement Learning For Deformable Object Manipulation; In Conference on Robot Learning; 10 pages; 2018.
Riedmiller, M et al., "Learning by Playing—Solving Sparse Reward Tasks From Scratch;" Cornell University, arXiv.org, arXiv:1802.10567v1; 18 pages; Feb. 28, 2018.
Ronneberger, O. et al. "U-Net: Convolutional Networks For Biomedical Image Segmentation;" Cornell University, arXiv.org, arXiv:1505.04597v1; 8 pages; May 18, 2015.
Sadeghi, F. et al., "(Cad)2RL: Real Single-Image Flight Without a Single Real Image;" Cornell University, arXiv.org, arXiv:1611.04201v2; 11 pages; Dec. 7, 2016.
Sadeghi, F. et al., "Sim2real View Invariant Visual Servoing By Recurrent Control;" Cornell University, arXiv.org, arXiv:1712.07642v1; 11 pages; Dec. 20, 2017.
Tobin, J et al., "Domain Randomization for Transferring Deep Neural Networks From Simulation to the Real World;" 2017 IEEE/RSJ International Conference on Intelligent Robots and Systems (IROS), 8 pages, 2017.
Ulyanov, D. et al., "Instance Normalization: The Missing Ingredient for Fast Stylization;" Cornell University, arXiv.org, arXiv:1607.08022v2; 6 pages; Sep. 20, 2016.
Watkins, C. et al., "Q-Learning;" Machine Learning, 8; pp. 279-292; 1992.
Yoo, D. et al., "Pixel-Level Domain Transfer;" Cornell University, arXiv.org, arXiv:1603.07442v3; 17 pages; Nov. 28, 2016.
Zhang, H. et al., "Self-Attention Generative Adversarial Networks;" Cornell University, arXiv.org, arXiv:1805.08318v2; 10 pages: Jun. 14, 2018.
Zhu, J. et al., "Unpaired Image-To-Image Translation Using Cycle-Consistent Adversarial Networks;" 2017 IEEE International Conference on Computer Vision (ICCV), 10 pages.
Patel, V. et al., "Visual Domain Adaptation: A Survey of Recent Advances;" IEEE Signal Processing Magazine; pp. 53-69, May 2015.
Coumans, E.; "Bullet Physics Simulation;" In ACM SIG-GRAPH 2015 Courses, Article No. 7; 2 pages; Jul. 2015.

* cited by examiner

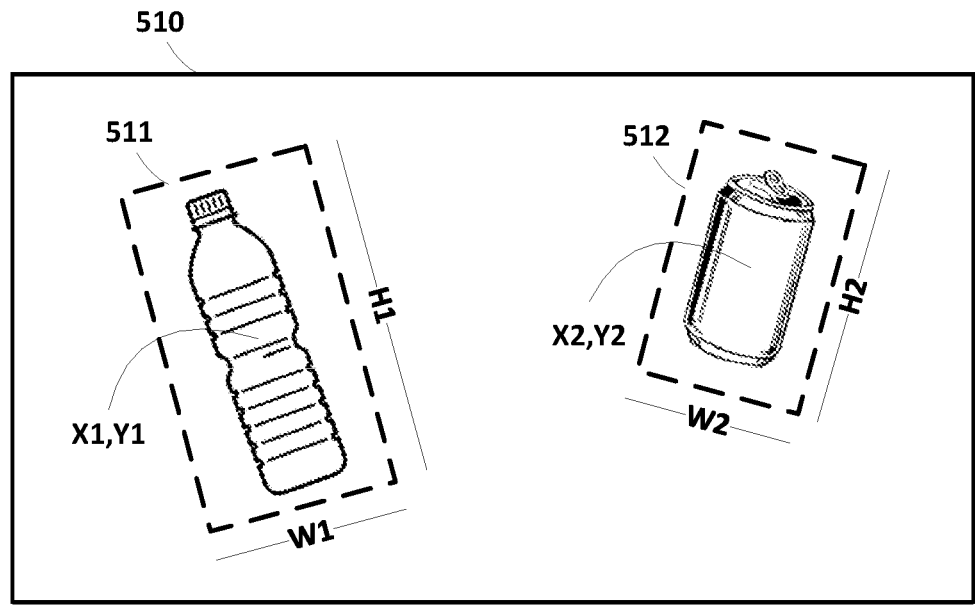
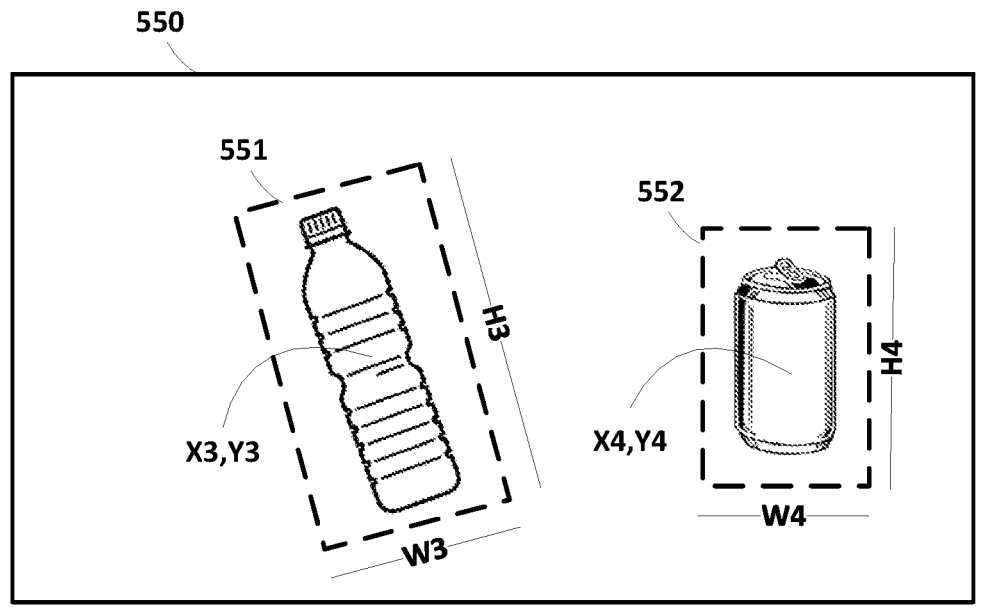
FIG. 5

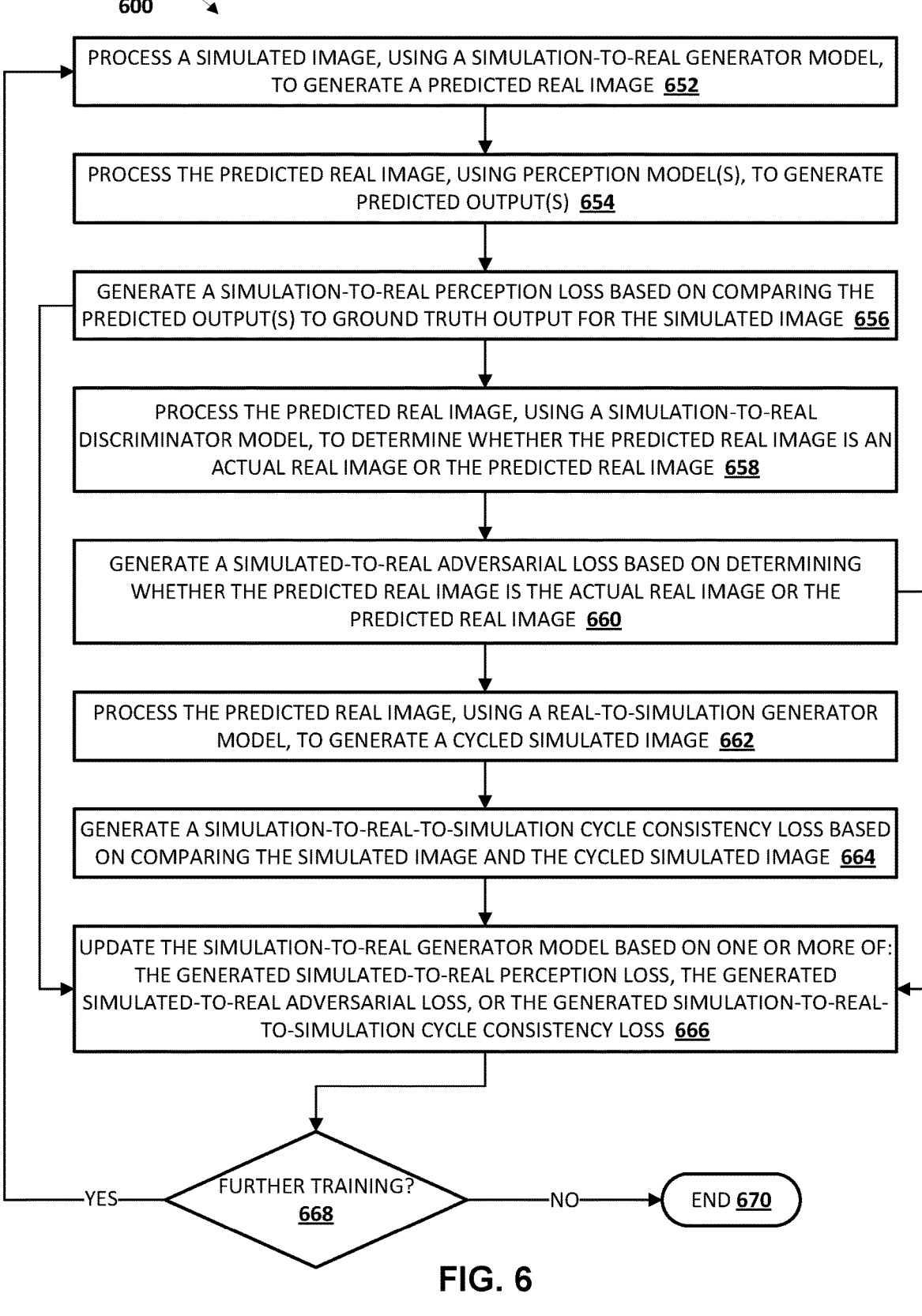

600

PROCESS A SIMULATED IMAGE, USING A SIMULATION-TO-REAL GENERATOR MODEL, TO GENERATE A PREDICTED REAL IMAGE 652

PROCESS THE PREDICTED REAL IMAGE, USING PERCEPTION MODEL(S), TO GENERATE PREDICTED OUTPUT(S) 654

GENERATE A SIMULATION-TO-REAL PERCEPTION LOSS BASED ON COMPARING THE PREDICTED OUTPUT(S) TO GROUND TRUTH OUTPUT FOR THE SIMULATED IMAGE 656

PROCESS THE PREDICTED REAL IMAGE, USING A SIMULATION-TO-REAL DISCRIMINATOR MODEL, TO DETERMINE WHETHER THE PREDICTED REAL IMAGE IS AN ACTUAL REAL IMAGE OR THE PREDICTED REAL IMAGE 658

GENERATE A SIMULATED-TO-REAL ADVERSARIAL LOSS BASED ON DETERMINING WHETHER THE PREDICTED REAL IMAGE IS THE ACTUAL REAL IMAGE OR THE PREDICTED REAL IMAGE 660

PROCESS THE PREDICTED REAL IMAGE, USING A REAL-TO-SIMULATION GENERATOR MODEL, TO GENERATE A CYCLED SIMULATED IMAGE 662

GENERATE A SIMULATION-TO-REAL-TO-SIMULATION CYCLE CONSISTENCY LOSS BASED ON COMPARING THE SIMULATED IMAGE AND THE CYCLED SIMULATED IMAGE 664

UPDATE THE SIMULATION-TO-REAL GENERATOR MODEL BASED ON ONE OR MORE OF: THE GENERATED SIMULATED-TO-REAL PERCEPTION LOSS, THE GENERATED SIMULATED-TO-REAL ADVERSARIAL LOSS, OR THE GENERATED SIMULATION-TO-REAL-TO-SIMULATION CYCLE CONSISTENCY LOSS 666

FURTHER TRAINING? 668

YES — NO — END 670

FIG. 6

TRAINING A SIMULATION-TO-REAL MODEL, BASED ON PERCEPTION LOSSES, TO MITIGATE REALITY GAP IN ROBOTICS AND/OR OTHER APPLICATIONS

BACKGROUND

Various machine learning based approaches to robotic control have been proposed.

Some of those approaches train a machine learning model (e.g., a deep neural network model) that can be utilized to generate one or more predictions that are utilized in control of a robot, and train the machine learning model using training data that is based only on data from real-world physical robots. However, these and/or other approaches can have one or more drawbacks. For example, generating training data based on data from real-world physical robots requires heavy usage of one or more physical robots in generating data for the training data. This can be time-consuming (e.g., actually operating the real-world physical robots requires a large quantity of time), can consume a large amount of resources (e.g., power required to operate the robots), can cause wear and tear to the robots being utilized, and/or can require a great deal of human intervention.

In view of these and/or other considerations, use of robotic simulators has been proposed to generate simulated data that can be utilized in generating simulated training data that can be utilized in training of the machine learning models. However, there is often a meaningful "reality gap" that exists between real robots and simulated robots (e.g., physical reality gap) and/or real environments and simulated environments simulated by a robotic simulator (e.g., visual reality gap). This can result in generation of simulated training data that does not accurately reflect what would occur in a real environment. This can affect performance of machine learning models trained on such simulated training data and/or can require a significant amount of real world training data to also be utilized in training to help mitigate the reality gap.

Various techniques have been proposed to address the visual reality gap. Some of those techniques randomize parameters of a simulated environment (e.g., textures, lighting, cropping, and camera position), and generate simulated images based on those randomized parameters. Such techniques theorize that a model trained based on training instances that include such simulated images will be better adapted to a real-world environment (e.g., since the real-world environment may be within a range of these randomized parameters). However, this randomization of parameters requires a user to manually define which parameters of the simulated environment are to be randomized. Moreover, policies generated using machine learning models trained based on simulated training data from randomized simulated environments can result in semantics (e.g., objects, robot pose(s), and/or other semantics) and styles (e.g., lighting, textures, and/or other styles) being removed during adaptation to real-world environments.

Some other techniques include training either a generative adversarial network model ("GAN" model) or a cycle generative adversarial network model ("CycleGAN" model) to adapt image-to-image translations between simulated environments and real-world environments.

Although both GAN models and CycleGAN models produce more realistic adaptations for real-world environments, policies generated using GAN models and CycleGAN models can still result in the aforementioned semantics and styles being removed during adaptation to real-world environments. As a result, an outcome of a robotic task (e.g., grasping task, navigational task, path planning task, etc.) performed by a robot that utilizes robotic control policies generated using the simulated data can be negatively impacted.

SUMMARY

Implementations disclosed herein relate to mitigating the reality gap through training a simulation-to-real machine learning model ("Sim2Real" model) based on loss(es) generated using already trained perception model(s), such as perception model(s) trained to process an image and generate predicted bounding area(s) and/or predicted classification(s) for object(s) in the image.

In some implementations, the perception model(s) can include, for example, a real perception model trained to generate predicted output based on processing real image(s). The real perception model(s) can be used to process a predicted real image to generate predicted output(s) (e.g., predicted bounding area(s) and/or predicted classification(s)). The predicted real image, processed using the real perception model(s), can be one generated by processing, using the Sim2Real model, a simulated image that is generated using a simulator (e.g., rendered using the simulator). As described herein, the Sim2Real model can be trained based on a perception loss that is generated based on comparing: (a) the predicted output(s), generated by processing the predicted real image using the real perception model, to (b) corresponding ground truth output(s), for the simulated image, that are determined from the simulator.

In some additional and/or alternative implementation, the perception model(s) can also include, for example, a simulated perception model trained to generate predicted output(s) based on processing simulated image(s). The simulated perception model(s) can be used to process a predicted simulated image to generate predicted output(s) (e.g., predicted bounding area(s) and/or predicted classification(s)). The predicted simulated image, processed using the simulated perception model(s), can be one generated by processing, using a real-to-simulation machine learning model ("Real2Sim" model), real image(s) that are captured by one or more real vision components. As described herein, the Sim2Real model can additionally and/or alternatively be trained based on a perception loss that is generated based on comparing: (a) the predicted output(s) generated by processing the predicted simulated image using the simulated perception model, to (b) corresponding ground truth output(s), for the real image(s), that are determined based on one or more labels assigned (e.g., manually) to the real image that is captured using one or more of the vision components. In some implementations, the real perception model and the simulated perception model can be the same perception model, whereas in other implementations, the real perception model and the simulated perception models are distinct perception models.

The predicted output(s) generated by the perception model(s) can include, for example, one or more bounding areas each corresponding to a respective object captured in the processed predicted real image or the predicted simulated image. The predicted output(s) generated by the perception model(s) can additionally or alternatively include, for each object or predicted bounding area, one or more corresponding predicted probabilities that are each indicative of a respective object classification of the object included in the predicted bounding area(s). In implementations where the predicted output(s) include the bounding area(s), the perception loss can be generated based on comparing one or more features of the bounding area (e.g., the size, center point, orientation, and/or other features) to corresponding features of ground truth bounding area(s) for the original simulated image and/or real image. For example, the perception loss can be generated based on a difference in N-dimensional space (i.e., 1-dimensional, 2-dimensional, 2.5-dimensional, 3-dimensional) between one or more of the features of the bounding area and the corresponding features of the ground truth bounding area. In implementations where the predicted output(s) include the one or more predicted probabilities corresponding to respective object classification(s), the perception loss can be generated based on comparing the one or more predicted probabilities to one or more ground truth probabilities. For example, assume that an object captured in the predicted real image and/or the predicted simulated image is a water bottle (e.g., the ground truth probability for the water bottle is 1.00), and assume that the perception model(s) generate a corresponding predicted probability of 0.75 that the object is a water bottle. In this example, the perception loss can be generated based on comparing the corresponding predicted probability (e.g., 0.75) to the ground truth probability (e.g., 1.00).

In various implementations, the Sim2Real model can be further trained based on additional losses. The additional losses can be used in updating the Sim2Real model along with, or separate from, the perception losses. For example, a loss function used in generating a loss to update parameters of the Sim2Real model can itself be a function of perception loss(es) (e.g., multiple of a batch) as well as additional loss(es) (e.g., multiple of the same batch). As another example, the loss used to update parameters of the Sim2Real model in some iterations can be based solely on perception loss(es) and, in other iterations (optionally interleaved with the perception loss iterations), can be based solely on additional loss(es). The additional loss(es) can include, for example, one or more adversarial losses, a cycle consistency loss, and/or other losses. The perception loss(es) and/or additional loss(es) can be backpropagated across the Sim2Real model to update one or more weights of the Sim2Real model, thereby training the Sim2Real model.

As one example, assume the Sim2Real model is a generator model of a Sim2Real generative adversarial network model ("GAN" model) that also includes a discriminator model. The Sim2Real model can generate a predicted real image(s) by processing the simulated image(s), and the discriminator model can determine whether the predicted real image(s) is an actual real image or the predicted real image(s) by processing the predicted real image(s). Based on the determination, an adversarial loss for the GAN model can be generated and utilized to further train the Sim2Real model. An adversarial loss for a Real2Sim GAN model can also be generated in a similar manner, and can also be utilized to further train the Sim2Real generator model. As another example, assume the Sim2Real model is generator model of a cycle generative adversarial network mode ("CycleGAN" model) that also includes the Real2Sim model (e.g., "Sim2Real2Sim CycleGAN" model). The Sim2Real portion of the CycleGAN model can generate predicted real image(s) by processing the simulated image(s), and the Real2Sim portion of the CycleGAN can generate cycled simulated image(s) by processing the predicted real image(s). This results in an image triple of [simulated image, predicted real image, cycled simulated image], and since each of the images in the image triple represent the same scene, there should be little to no variance in the images of the image triple. The simulated image(s) and the cycled simulated image(s) can be compared, and a cycle consistency loss for the Sim2Real2Sim model can be determined based on the comparison. The cycle consistency loss can be utilized to further train the Sim2Real portion of the Sim2Real2Sim CycleGAN model. A cycle consistency loss for a Real2Sim2Real CycleGAN model can also be generated in a similar manner, and can also be utilized to further train the Sim2Real generator model.

In these and other manners, the Sim2Real model can be trained to generate predicted real images that are effective for various tasks that involve perception of objects in an environment. This can help mitigate the reality gap as the Sim2Real model is trained to generate predicted real images that include attributes (e.g., styles and/or semantics of the environment) that are relevant at least to perception of objects (e.g., identifying and/or recognizing/classifying the objects). The trained Sim2Real model can then be utilized to generate robotic control policies that are generated using simulated data (e.g., trained based on predicted real images generated using simulated data and the trained Sim2Real model), and that more accurately reflect real world environments. Accordingly, performance of the Sim2Real model is improved at least in that the reality gap, for predicted real images generated using the Sim2Real model, is mitigated. Further, the trained Sim2Real model can be subsequently utilized in generating further predicted real images, from simulated data, and those predicted real images utilized in training additional machine learning model(s), such as models that represent robotic control policies for use on a real robot. Due to the mitigated reality gap from the Sim2Real model, the generated predicted real images can lead to those additional machine learning model(s) being trained more efficiently (e.g., with less training data) and/or to being more robust (e.g., when deployed on robots) once trained. For example, a majority (or even all) of the training data used in training those additional machine learning model(s) can include predicted real images that are generated using simulated data and the Sim2Real model. Such predicted real images and/or supervised labels (e.g., automatically generated based on simulator data) therefore can be generated more efficiently (e.g., less usage of power and processor resources) than, for example, actual real images and/or manual labels therefore.

The above description is provided as an overview of some implementations of the present disclosure. Further description of those implementations, and other implementations, are described in more detail below.

BRIEF DESCRIPTION OF THE DRAWINGS

FIG. 5 depicts example images annotated with various features, in accordance with various implementations.

FIG. 6 is a flowchart illustrating an example method of training a simulation-to-real model using loss(es) generated by a simulation-to-real-to-simulation cycle generative adversarial network model, in accordance with various implementations disclosed herein.

DETAILED DESCRIPTION

Figure 1:
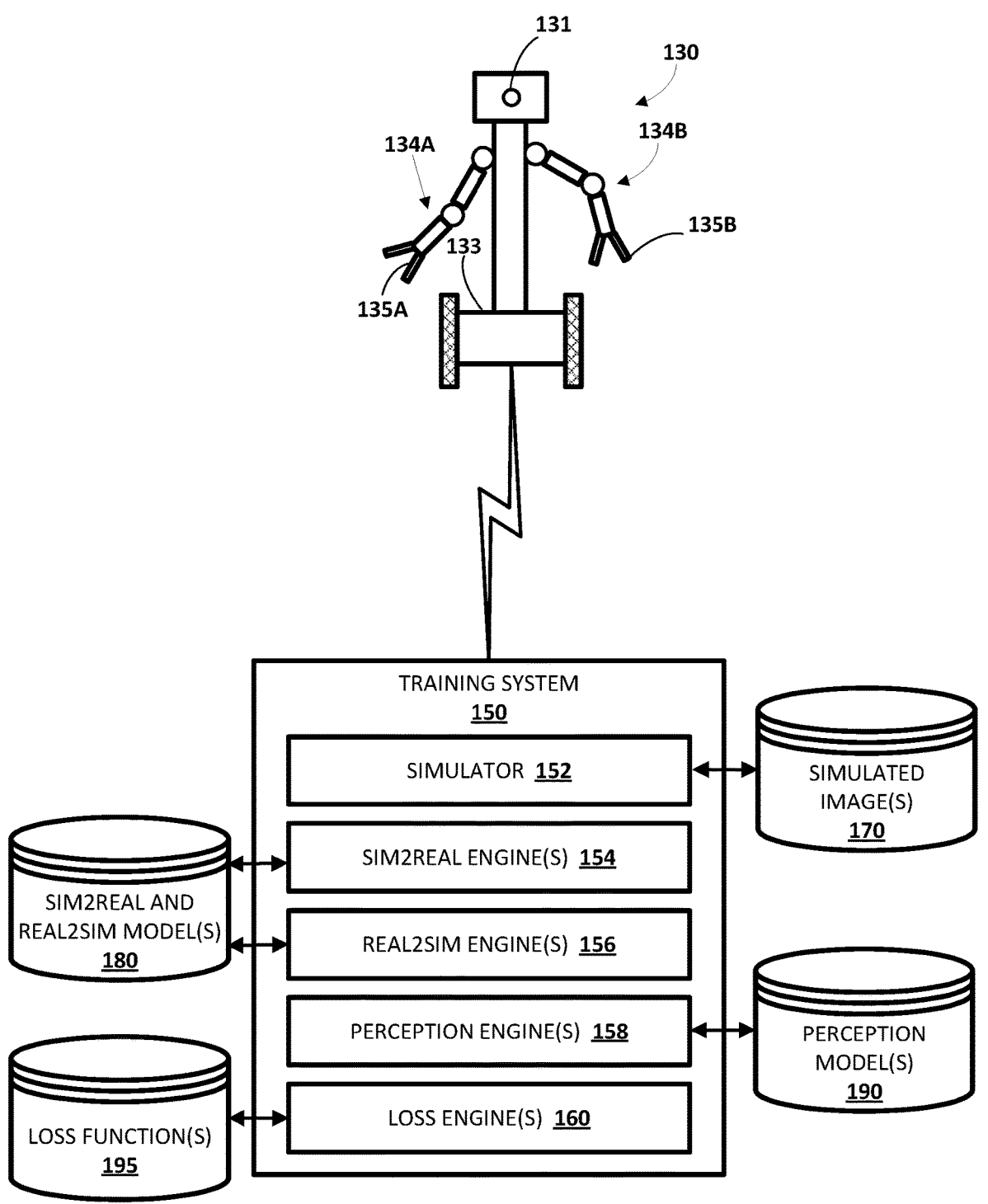
FIG. 1 illustrates an example robot, and an example training system, in accordance with various implementations disclosed herein.

FIG. 1 illustrates an example robot 130 and an example training system 150. Robot 130 includes a base 133 with wheels provided on opposed sides thereof for locomotion of the robot 130. The base 133 may include, for example, one or more motors for driving the wheels of the robot 130 to achieve a desired direction, velocity, and/or acceleration of movement for the robot 130. Although robot 130 is depicted as a mobile robot in FIG. 1 having the base 133 with wheels provided on opposed sides thereof for locomotion of the robot 130, it should be understood that is for the sake of example and is not meant to be limiting, and that additional and/or alternative robots, mobile or immobile, may be provided. For example, mobile telepresence robots, humanoid robots, robotic arms, and/or other robots may be provided as the only robots and/or with other robots in some implementations.

Robot 130 also includes vision component(s) 131. In some implementations, the vision component(s) 131 may include a monocular camera that includes a single sensor (e.g., a charge-coupled device (CCD)), and generates, based on physical properties sensed by the sensor, images that each includes a plurality of data points defining color values and/or grayscale values. For instance, the monocular camera may generate images that include red, blue, and/or green channels. Each channel may define a value for each of a plurality of pixels of the image such as a value from 0 to 255 for each of the pixels of the image. In some implementations, the vision component(s) 131 may include a stereographic camera that includes two or more sensors, each at a different vantage point. In some of those implementations, the stereographic camera generates, based on characteristics sensed by the two sensors, images that each includes a plurality of data points defining depth values and color values and/or grayscale values. For example, the stereographic camera may generate images that include a depth channel and red, blue, and/or green channels. In some implementations, the vision component(s) 131 may include a stereographic camera, but only one of the sensors may be used to generate images that do not include a depth channel. Additional vision component(s) separate from robot 130 can also be included to capture real image(s).

Robot 130 also includes one or more processors that, for example, provide control commands to actuators and/or other operational components thereof, generate control commands for various tasks, etc. For example, one or more processors of robot 130 may provide control commands to servo motors that drive the wheels of the robot 130 to navigate the robot 130 to various locations in the environment autonomously and/or semi-autonomously. Also, for example, one or more processors of robot 130 may implement all or aspects of training system 150 and/or perform all or aspects of method 600 of FIG. 6 and method 700 of FIG. 7. Additional description of some examples of the structure and functionality of various robots is provided herein (e.g., with respect to robot 820 of FIG. 8).

The robot 130 also includes robot arms 134A and 134B with corresponding end effectors 135A and 135B that each take the form of a gripper with two opposing "fingers" or "digits." The robot arms 134A, 134B and end effectors 135A, 135B may be controlled autonomously, semi-autonomously, and/or based on control commands provided by a user via a computing device of a user. For example, the robot arm 134B may be autonomously controlled to position the end effector 135B proximal to an object and the end effector 135B may be autonomously controlled to grasp the object. In some of those implementations, the processor(s) of the robot 130 may generate control commands to control robot arm 134B and/or end effector 135B and generating those control commands may be influenced at least in part by a current pose of the robot 130 determined according to techniques described herein.

All or aspects of training system 150 may be implemented by the robot 130 in some implementations. In some implementations, all or aspects of training system 150 may be implemented by one or more remote computing systems and/or devices that are in communication with the robot 130 (e.g., computing device 910 of FIG. 9) over network(s) (e.g., local area network (LAN), wide area network (WAN), Bluetooth, and/or other networks).

Various modules or engines may be implemented as part of training system 150 as software, hardware, or any combination of the two. For example, as shown in FIG. 1, training system 150 can include a simulator 152, simulation-to-real ("Sim2Real") engine(s) 154, real-to-simulation ("Real2Sim") engine(s) 156, perception engine(s) 158, and loss engine(s) 160.

The simulator 152 can be configured to generate simulated image(s) of an environment that includes one or more objects. The simulated image(s) can be generated during training of a Sim2Real generator model and/or generated prior to training of the Sim2Real generator model and stored in simulated image(s) database 170. In some implementations, each of the simulated image(s) can be generated with randomized parameters. The randomized parameters can include, for example, various disparate objects of disparate classes to be included in an environment of each of the simulated images, lighting intensity of the environment, textures of the objects in the environment, pose(s) of the objects in the environment, and/or other randomized styles and/or semantics of the simulated images. For example, a first simulated image can include a first object having a first size and a first orientation with a first lighting intensity, a second simulated image can include the first object having a second size and a second orientation with the first lighting intensity, a third simulated image can include a second object having a third size and third orientation with a second lighting intensity, and so on.

In some versions of those implementations, each of the parameters can be associated with one or more constraints. Although the simulated images are generated using randomized parameters, the constraints associated with the parameters can ensure that the resulting simulated images generated using the randomized parameters include simulated images of environments that that reflect those encountered in the real world. For instance, the objects included in the simulated images can be selected from a plurality of objects of a particular environment (e.g., a work environment, a home environment, a warehouse environment, and/or other environments), a maximum and minimum lighting intensity can be placed on the lighting intensity, the textures of the objects can be selected from a plurality of predefined textures, and so on. Accordingly, the simulated images can reflect real images of environments that may be encountered in the real world.

Moreover, the simulator 152 can determine ground truth output for each of the simulated images. The ground truth output can include, for example, ground truth bounding areas of objects included in the environment of the simulated images, ground truth probabilities for the objects included in the simulated images, ground truth probabilities that correspond to the fact that simulated images are in fact simulated images, and/or other ground truth output. For example, if a given perception model is trained to determine a predicted bounding area of an object, then the ground truth output can be a ground truth bounding area corresponding to the object in the simulated images. As another example, if a given perception model is trained to determine corresponding predicted probabilities that are each indicative of a respective object classification of the object or predicted bounding area, then the ground truth output can be a ground truth probability for the classification of the object or the predicted bounding area. As described herein, the ground truth output can be utilized in generating loss(es) for updating Sim2Real model(s).

As used herein, the "reality gap" that exists between real robots and simulated robots (e.g., physical reality gap) and/or real environments and simulated environments simulated by the simulator 152 (e.g., visual reality gap). The techniques disclosed herein are directed to mitigating the visual reality gap real environments and simulated environments simulated by the simulator 152.

Training of machine learning models that are robust and accurate, and that can be utilized for control of real-world physical robots, is often limited by the scalability of using real-world physical robots to generate a sufficient quantity of training data and/or to generate training data that is sufficiently diverse. For example, for many challenging robotic tasks (e.g., object manipulation tasks, navigational task, path planning tasks, and/or other robotic tasks), repeatedly running real robot experiments to collect real training data is infeasible in the real world. Accordingly, training of machine learning models using simulated training data from the simulator 152 is a faster and cheaper alternative compared to collecting and using real training data. However, the simulated training data must be of sufficient quality for the machine learning models that are trained using the simulated training data to translate to the real world. Thus, various machine learning model(s) that are used to generate the simulated training data must also be trained.

The Sim2Real engine(s) 154 can process simulated image(s) (or vision data associated therewith), using Sim2Real model(s) stored in Sim2Real and Real2Sim model(s) database 180, to generate predicted real image(s) and/or cycled real image(s). The simulated image(s) can include, for example, simulated image(s) generated by the simulator 152 (or previously generated simulated image(s) stored in the simulated image(s) database 170), predicted simulated images generated using Real2Sim model(s) stored in the Sim2Real and Real2Sim model(s) database 180, and/or any other simulated image(s). Further, the Sim2Real engine(s) 156 can process real image(s) (or vision data associated therewith), using Real2Sim model(s) stored in Sim2Real and Real2Sim model(s) database 180, to generate predicted simulated image(s) and/or cycled simulated image(s). The real image(s) can include, for example, real image(s) captured by one or more vision component(s) (e.g., captured by vision component(s) 131 of robot 130 and/or any other vision component), predicted real images generated using Sim2Real model(s) stored in the Sim2Real and Real2Sim model(s) database 180, and/or any other real image(s).

In some implementations, the Sim2Real model(s) used by the Sim2Real engine(s) 154 includes a generator model of a Sim2Real generative adversarial network mode ("GAN" model). The Sim2Real GAN model includes at least a Sim2Real generator model and a Sim2Real discriminator model. In some versions of those implementations, the Sim2Real generator model is used to process a given simulated image (or vision data associated therewith) to generate a predicted real image that corresponds to the given simulated image. Further, the Sim2Real discriminator model can be used to evaluate the predicted real image to predict whether the predicted real image is truly a real image or a predicted real image generated using the Sim2Real generator model. A Sim2Real adversarial loss can be generated based on the prediction generated using the Sim2Real discriminator model. Thus, the goal of the Sim2Real generator models is to "fool" the Sim2Real discriminator models to maximize the Sim2Real adversarial loss, and the goal of the Sim2Real discriminator model(s) is to minimize the Sim2Real adversarial loss thereby improving the Sim2Real GAN model. The Sim2Real adversarial loss can be sent to the loss engine(s) 160 to be used in updating the Sim2Real model. The Sim2Real GAN model is described in greater detail herein with respect to FIG. 3A In some additional and/or alternative implementations, the Real2Sim model(s) used by the Real2Sim engine(s) 156 includes a generator model of a Real2Sim GAN model. The Real2Sim GAN model includes at least a Real2Sim generator model and a Real2Sim discriminator model. In some versions of those implementations, the Real2Sim generator model can be used to process a given real image (or vision data associated therewith) to generate a predicted simulated image that corresponds to the given real image. Further, a Real2Sim discriminator model can evaluate the predicted simulated image to predict whether the predicted simulated image is truly a simulated image or a predicted simulated image generated by the Real2Sim generator model. A Real2Sim adversarial loss can be generated based on the prediction generated using the Real2Sim discriminator model. Thus, the goal of the Real2Sim generator models is to "fool" the Real2Sim discriminator models to maximize the Real2Sim adversarial loss, and the goal of the discriminator model(s) is to minimize the Real2Sim adversarial loss thereby improving the Real2Sim GAN model. The Real2Sim adversarial loss can be sent to the loss engine(s) 160 to be used in updating the Sim2Real model.

In some additional and/or alternative implementations, the Sim2Real model(s) used by the Sim2Real engine(s) 154 includes a Sim2Real generator model of simulation-to-real-to-simulation ("Sim2Real2Sim") cycle generative adversarial network model ("CycleGAN" model), and the Real2Sim model(s) used by the Real2Sim engine(s) 156 includes a Real2Sim generator model of the Sim2Real2Sim CycleGAN model. The Sim2Real2Sim CycleGAN model includes at least a Sim2Real GAN model and a Real2Sim GAN model, where both of the Sim2Real GAN model and the Real2Sim GAN model each include a corresponding generator model and a corresponding discriminator model. In some versions of those implementations, a Sim2Real generator model, of the Sim2Real2Sim CycleGAN model, process a given simulated image (or vision data associated therewith) to generate a predicted real image that corresponds to the given simulated image. Further, a Sim2Real discriminator model, of the Sim2Real2Sim CycleGAN model, can evaluate the predicted real image to predict whether the predicted real image is truly a real image or a predicted real image generated by the Sim2Real generator model (e.g., to generate a Sim2Real adversarial loss). Moreover, a Real2Sim generator model, of the Sim2Real2Sim CycleGAN model, can process the predicted real image (or vision data associated therewith) to generate a cycled simulated image that corresponds to the predicted real image. Accordingly, the cycled simulated image should also correspond to the original simulated image. Put another way, utilization of this Sim2Real2Sim CycleGAN technique results in a Sim2Real2Sim image triple of [simulated image, predicted real image, cycled simulated image], and there should be little to no variance across the images of the Sim2Real2Sim image triple. Further, a Sim2Real2Sim cycle consistency loss for the Sim2Real2Sim CycleGAN model can be determined based on comparing the simulated image to the cycled simulated image. In some further versions of those implementations, a Real2Sim discriminator model, of the Sim2Real2Sim CycleGAN model, can evaluate the predicted simulated image to predict whether the cycled simulated image is truly a simulated image or a cycled simulated image generated by the Real2Sim generator model (e.g., to generate a Real2Sim adversarial loss). The Sim2Real2Sim cycle consistency loss and/or one or more of the adversarial losses can be sent to the loss engine(s) 160 to be used in updating the Sim2Real model(s). The Sim2Real2Sim CycleGAN model is described in greater detail herein with respect to FIGS. 3B and 3C.

In some additional and/or alternative implementations, the Sim2Real model(s) used by the Sim2Real engine(s) 154 includes a Sim2Real generator model of real-to-simulation-to-real ("Real2Sim2Real") cycle generative adversarial network model ("CycleGAN" model), and the Real2Sim model(s) used by the Real2Sim engine(s) 156 includes a Real2Sim generator model of the Sim2Real2Sim Cycle-GAN model. The Real2Sim2Real CycleGAN model includes at least a Real2Sim GAN model and a Sim2Real GAN model, where both of the Real2Sim GAN model and the Sim2Real GAN model each include a corresponding generator model and a corresponding discriminator model. In some versions of those implementations, a Real2Sim generator model, of the Real2Sim2Real CycleGAN model, processes a given real image (or vision data associated therewith) to generate a predicted simulated image that corresponds to the given real image. Further, a Real2Sim discriminator model, of the Real2Sim2Real CycleGAN model, can evaluate the predicted simulated image to predict whether the predicted simulated image is truly a simulated image or a predicted simulated image generated by the Real2Sim generator model (e.g., to generate a Real2Sim adversarial loss). Moreover, a Sim2Real generator model, of the Real2Sim2Real CycleGAN model, can process the predicted simulated image (or vision data associated therewith) to generate a cycled real image that corresponds to the predicted simulated image. Accordingly, the cycled real image should also correspond to the original real image. Put another way, utilization of this Real2Sim2Real CycleGAN technique results in a Real2Sim2Real image triple of [real image, predicted simulated image, cycled real image], and there should be little to no variance across the images of the Real2Sim2Real image triple. Further, a Real2Sim2Real cycle consistency loss for the Real2Sim2Real CycleGAN model can be determined based on comparing the real image to the cycled real image. In some further versions of those implementations, a Sim2Real discriminator model, of the Real2Sim2Real CycleGAN model, can evaluate the predicted simulated image to predict whether the predicted simulated image is truly a real image or a cycled real image generated by the Real2Sim generator model (e.g., to generate a Sim2Real adversarial loss). The Real2Sim2Real cycle consistency loss and/or one or more of the adversarial losses can be sent to the loss engine(s) 160 to be used in updating the Sim2Real model(s). The Real2Sim2Real CycleGAN model is described in greater detail herein with respect to FIGS. 4A and 4B.

In various implementations, the Sim2Real model(s) used by the Sim2Real engine(s) 154 described above with respect to the various GAN models and CycleGAN models can be the same Sim2Real model(s). For example, a Sim2Real model of a Sim2Real GAN model can be the same Sim2Real model utilized in the Sim2Real2Sim CycleGAN model and the Real2Sim2Real CycleGAN model. Further, the Real2Sim model(s) used by the Real2Sim engine(s) 156 described above with respect to the various GAN models and CycleGAN models can be the same Real2Sim model(s). For example, a Real2Sim model of a Real2Sim GAN model can be the same Sim2Real model utilized in the Sim2Real2Sim CycleGAN model and the Real2Sim2Real CycleGAN model. In other implementations, multiple Sim2Real model(s) can be utilized by the Sim2Real engine(s) 154 and/or multiple Real2Sim model(s) can be utilized by the Real2Sim engine(s) 156.

The perception engine(s) 158 can process predicted real image(s) (or vision data associated therewith) and/or predicted simulated image(s), using perception model(s) stored in perception model(s) database 190, to generate predicted output(s). The predicted output(s) generated by the perception model(s) can include, for example, one or more bounding areas each corresponding to a respective object captured in the processed predicted real image or the predicted simulated image. The predicted output(s) generated by the perception model(s) can additionally or alternatively include, for each object or predicted bounding area, one or more corresponding predicted probabilities that are each indicative of a respective object classification of the object included in the predicted bounding area(s). In implementations where the predicted output(s) include the bounding area(s), a perception loss can be generated based on comparing one or more features of the bounding area (e.g., the size, center point, orientation, and/or other features) to corresponding features of ground truth bounding area(s) for the original simulated image and/or real image. In implementations where the predicted output(s) include the one or more predicted probabilities corresponding to respective object classification(s), a perception loss can be generated based on comparing the one or more predicted probabilities to one or more ground truth probabilities. The predicted output(s) and corresponding ground truth output is discussed in greater detail below with respect to FIG. 5.

Moreover, a perception cycle consistency loss can be generated based on processing an image triple generated by a CycleGAN model. In implementations where the Sim2Real model is a Sim2Real generator model of a Sim2Real2Sim CycleGAN model, a Sim2Real2Sim image triple of [simulated image, predicted real image, cycled simulated image] is generated as noted above. Each of the images of the Sim2Real2Sim image triple can be processed, using the perception model(s) stored in the perception model(s) database 190, to generate corresponding predicted output(s) for each of the images of the Sim2Real2Sim image triple. As described in greater detail below (e.g., with respect to FIG. 5), the predicted output for the original simulated image can be utilized as ground truth output for purposes of comparing to the predicted output for the predicted real image and/or comparing to the predicted output for the cycled simulated image. Pairwise comparisons between the ground truth output for the original simulated image, the predicted real image, and the cycled simulated image can be performed, and the perception cycle consistency loss can be determined as a function of the pairwise comparisons. The perception cycle consistency loss for the Sim2Real2Sim CycleGAN model is sometimes referred to herein as a Sim2Real2Sim perception cycle consistency loss, and is described in greater detail below with respect to FIG. 3C.

Further, in implementations where the Sim2Real model is a Sim2Real generator model of a Real2Sim2Real CycleGAN model, a Real2Sim2Real image triple of [real image, predicted simulated image, cycled real image] is generated as noted above. Each of the images of the Real2Sim2Real image triple can be processed, using the perception model(s) stored in the perception model(s) database 190, to generate corresponding predicted output(s) for each of the images of the Real2Sim2Real image triple. As described in greater detail below (e.g., with respect to FIG. 5), the predicted output for the original real image can be utilized as ground truth output for purposes of comparing to the predicted output for the predicted simulated image and/or comparing to the predicted output for the cycled real image. Pairwise comparisons between the ground truth output for the original real image, the predicted simulated image, and the cycled real image can be performed, and the perception cycle consistency loss can be determined as a function of the pairwise comparisons. The perception cycle consistency loss for the Real2Sim2Real CycleGAN model is sometimes referred to herein as a Real2Sim2Real perception cycle consistency loss, and is described in greater detail below with respect to FIG. 4B.

In some implementations, a first perception model can be utilized to process the predicted real image(s), and a disparate second perception model can be utilized to process the predicted simulated image(s). In some versions of those implementations, the first perception model can be trained using mostly (or even exclusively) real training instances. Each of the real training instances can include real training instance input and corresponding real training instance output. The real training instance input can include a real image of an environment, and the corresponding real training instance output can include ground truth output for the real image. The ground truth output for the real image can include one or more labels or annotations assigned to the real image of the real training instance input. For example, the ground truth output can include a respective object classification of object(s) in the environment of the real image, bounding area(s) of the object(s) in the environment of the real image, center point(s) of the object(s) in the environment of the real image, and/or other output that the first perception model is trained to predict. In some versions of those implementations, the second perception model can be trained using mostly (or even exclusively) simulated training instances. Each of the simulated training instances can include simulated training instance input and corresponding simulated training instance output. The simulated training instance input can include a simulated image of an environment, and the corresponding simulated training instance output can include ground truth output for the simulated image. The ground truth output for the simulated image can include one or more labels or annotations assigned to the simulated image of the simulated training instance input that are determined by the simulator 152 when the simulated image is generated. For example, the ground truth output can include a respective object classification of object(s) in the environment of the simulated image, bounding area(s) of the object(s) in the environment of the simulated image, center point(s) of the object(s) in the environment of the simulated image, and/or other output that the second perception model is trained to predict.

In some additional and/or alternative implementations, a single perception model can be utilized to process both the predicted real image(s) and the predicted simulated image(s) (or vision data associated therewith). In some versions of those implementations, the perception model can be trained using mixed training instances. Each of the mixed training instances can include mixed training instance input and corresponding mixed training instance output. The mixed training instance input can include a real image or a simulated image, and the corresponding mixed training instance output can include ground truth output for the simulated image or the real image of the mixed training instance input. Put another way, the perception model can be trained using training instances that include both real training instances and simulated training instances described above with respect to the first perception model and the second perception model.

The perception model(s) can include, for example, a regions with convolutional neural network model ("R-CNN" model), a fast R-CNN model, a faster R-CNN model, a region proposal network model ("RPN" model), and/or other perception model(s). One or more of these perception models can be trained using the above training instance to generate predicted output(s). The predicted output(s) can be sent to the loss engine(s) 160 to be utilized in generating a perception loss, and the perception loss can be utilized in updating the Sim2Real model(s). In implementations where the perception model(s) include the first perception model trained using the real training instances and the disparate second perception model trained using the simulated training instances, the resulting perception loss generated based on processing the predicted real image(s) can be considered a Sim2Real perception loss and the resulting perception loss generated based on processing the predicted simulated image(s) can be considered a Real2Sim perception loss. In some versions of those implementations, one or both of the Sim2Real perception loss and the Real2Sim perception loss can be utilized in updating the Sim2Real model(s). In implementations where the perception model(s) include the single perception model trained using the mixed training instances, the resulting perception loss can simply be considered a perception loss.

The loss engine(s) 160 can compare the predicted output(s) generated by the perception model(s) and corresponding ground truth output to generate the perception loss.

Comparing the predicted output(s) generated by the perception model(s) and the corresponding ground truth output to generate the perception loss is described in greater detail below with respect to FIG. 5. In some implementations, the loss engine(s) 160 can process the various losses described herein, using one or more loss functions stored in loss function(s) database 195, to generate an update for the Sim2Real model(s). The loss functions can include one or more weights associated with each of the losses, and the update for the Sim2Real model(s) can be a function of the weighted losses. For example, a Sim2Real perception loss can be associated with a first weight, a Real2Sim perception loss can be associated a second weight, a Sim2Real adversarial loss can be associated with a third weight, a Real2Sim adversarial loss can be associated with a fourth weight, a Sim2Real2Sim cycle consistency loss can be associated with a fifth weight, a Real2Sim2Real cycle consistency loss can be associated with a sixth weight, a Sim2Real2Sim perception consistency loss can be associated with a seventh weight, a Real2Sim2Real perception consistency loss can be associated with an eighth weight, and/or other losses can be associated other respective weights. By weighting the losses, certain losses can have greater influence in updating the Sim2Real model(s). The loss engine(s) 160 can cause the update for the Sim2Real model(s) of GAN model(s) and/or CycleGAN model(s) to be backpropagated across the GAN model(s) and/or CycleGAN model(s), thereby updating and training the Sim2Real model(s). In some additional and/or alternative implementations, the loss engine(s) 160 can cause one or more of the individual losses described herein to be backpropagated across the GAN model(s) and/or CycleGAN model(s), thereby updating and training the Sim2Real model(s) (and optionally the Real2Sim model(s)).

In some implementations, only the perception loss (e.g., Sim2Real perception loss and/or Real2Sim perception loss) is utilized in generating the update for the Sim2Real model(s). In some versions of those implementations, the other losses described herein may not be generated to conserve computational resources. In some additional and/or alternative implementations, only a subset of the losses described herein may be utilized in generating the update for the Sim2Real model(s). For example, only a Sim2Real perception loss and a Sim2RealSim cycle consistency loss may be utilized in generating the update for the Sim2Real model(s). As another example, only a Sim2Real perception loss, a Sim2Real perception loss, a Sim2Real adversarial loss, and a Sim2RealSim cycle consistency loss may be utilized in generating the update for the Sim2Real model(s). Thus, any combination of the losses described herein can be utilized in generating the update for the Sim2Real model(s).

While robot 130 and training system 150 are depicted separately in FIG. 1, this is not meant to be limiting. In various implementations, one or more aspects of training system 150 may be implemented on the robot 130. For example, all or aspects of one or more of the engines 152, 154, 156, 158, and/or 160 may be implemented via hardware (e.g., processor(s)) of the robot 130. Also, for example, all or aspects of the databases 170, 180, 190, and/or 195 may be stored in memory of robot 130. In implementations where the robot 130 and one or more aspects of training system 150 are separate components, they may communicate over one or more wired or wireless networks or using other wireless technology, such as LANS, WANs, radio, Bluetooth, infrared, and so on. In implementations where one or more aspects of the databases 170, 180, 190, and/or 195 are separate from robot 130, robot 130 may access the databases 170, 180, 190, and/or 195 using one or more wired or wireless networks or using other wireless technology.

Figure 2:
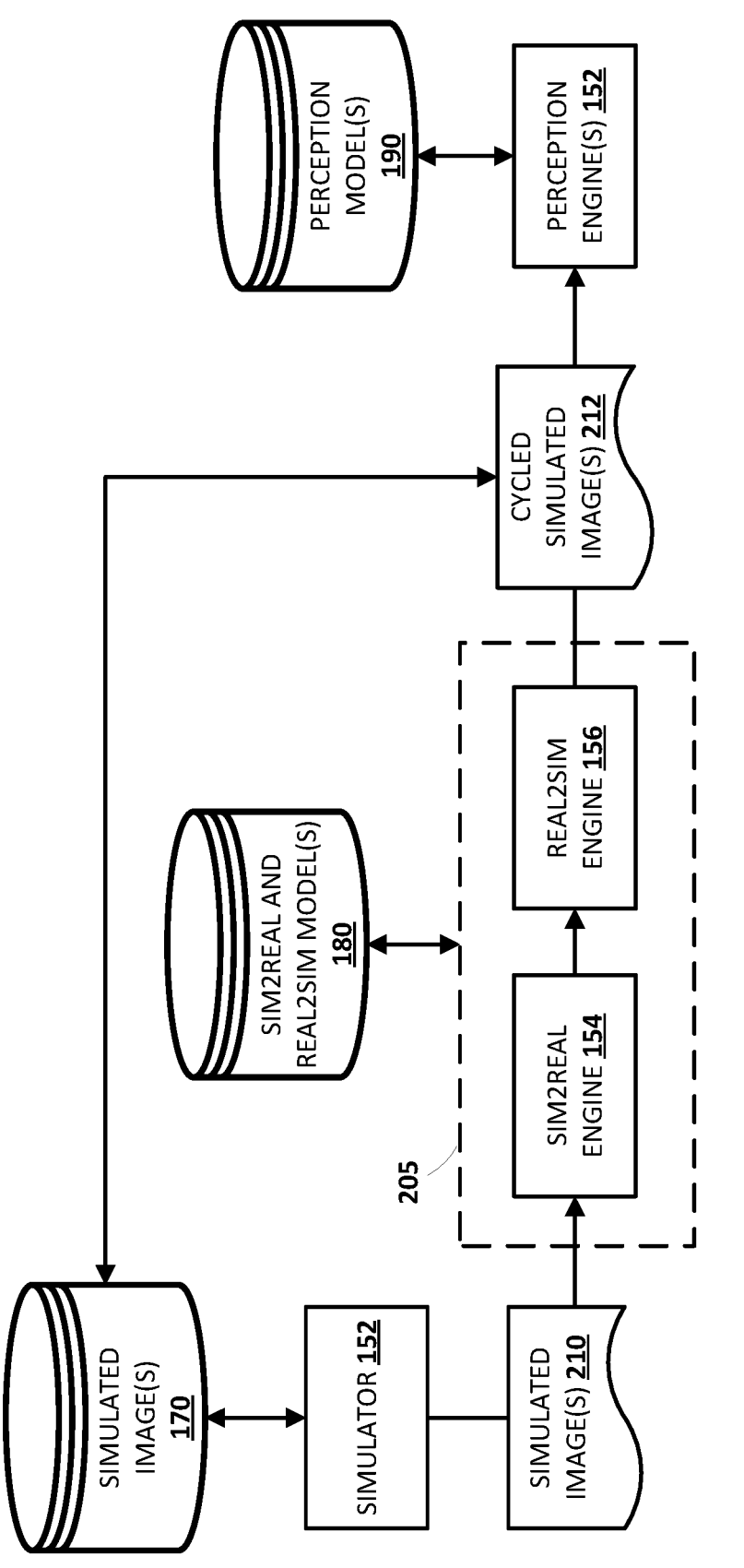
FIG. 2 is an example process flow of using a simulation-to-real model and perception model from the example training system of FIG. 1, in accordance with various implementations disclosed herein.

Turning now to FIG. 2, an example process flow of using a simulation-to-real model ("Sim2Real" model) and perception model from the training system 150 of FIG. 1 is depicted. In some implementations, the simulator 152 can generate simulated image(s) 210, or retrieve the simulated image(s) 210 from the simulated image(s) database 170. The simulated image(s) 210 can be applied as input across a cycle generative adversarial network model 205 ("Cycle-GAN" model) to generate cycled simulated image(s) 212. More particularly, the CycleGAN model 205 can include the Sim2Real engine 154 for processing the simulated image(s) 210, using Sim2Real model(s) stored in the Sim2Real and Real2Sim model(s) database 180, to generate a predicted real image, and the Real2Sim engine 156 for processing the predicted real image(s), using Real2Sim model(s) stored in the Sim2Real and Real2Sim model(s) database 180, to generate the cycled simulated image(s) 212. In some additional and/or alternative implementations, the simulator 152 and the CycleGAN model 205 may be omitted if the cycled simulated image(s) 212 were previously generated and stored in the simulated image(s) database 170.

The predicted real image(s) and/or the cycled simulated image(s) 212 provide more accurate representations of real world environments when compared to the raw simulated images 210 generated by the simulator 152. Moreover, when the predicted real image(s) are generated using a Sim2Real model that is trained using the techniques described herein and/or when the cycled simulated image(s) 212 generated using are generated using the CycleGAN model 205 that utilizes a Sim2Real model that is trained using the techniques described herein, the predicted real image(s) and the cycled simulated image(s) 212 preserve attributes (e.g., styles, such as lighting, textures, and/or other styles, and/or semantics, such as objects, object pose(s), and/or other semantics, of the environment) that are relevant at least to perception of objects (e.g., identifying, recognizing, and/or classifying the objects). Accordingly, the predicted real image(s) and/or the cycled simulated image(s) 212 can then be used to generate simulated training data for training other machine learning models. As one non-limiting example, the predicted real image(s) and/or the cycled simulated image(s) 212 can be utilized by the perception engine(s) 152 to further train the perception model(s) 190 described herein to generate refined perception model(s). These refined perception model(s) and/or robotic control policies generated using these refined perception model(s) can then be utilized by real robots in performing tasks in real environments.

Figure 3A:
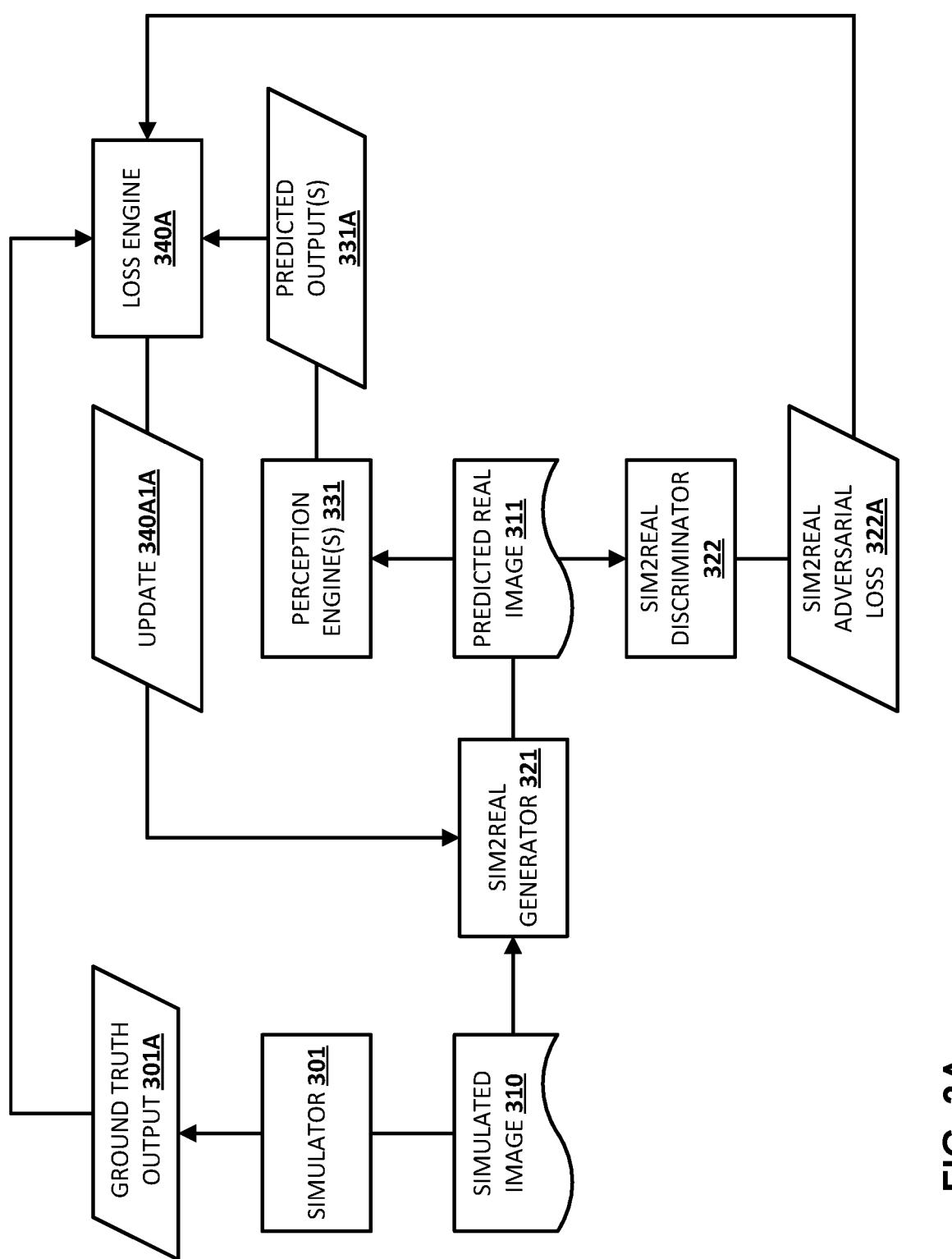
FIG. 3A is an example process flow of generating a perception loss using a simulation-to-real generative adversarial network model for updating a simulation-to-real model, in accordance with various implementations disclosed herein.

Turning now to FIG. 3A, an example process flow of generating a perception loss using a simulation-to-real ("Sim2Real") generative adversarial network model ("GAN" model) for updating a Sim2Real model is depicted. The process flow of FIG. 3A can be implemented using various components described above with respect to FIG. 1. In some implementations, a Sim2Real perception loss can be utilized in generating updates to train the Sim2Real model. The Sim2Real model can be, for example, a Sim2Real generator model of the Sim2Real GAN model. Simulator 301 (e.g., simulator 152 of FIG. 1) can generate a simulated image 310, and determine ground truth output 301A for the simulated image 310. Sim2Real generator 321 can process the simulated image 310 (or a simulated image from the simulated image(s) database 170 of FIG. 1), using Sim2Real generator model(s) (e.g., stored in the Sim2Real and Real2Sim model(s) database 180 of FIG. 1) to generate a predicted real image 311. Sim2Real discriminator 322 can process the predicted real image 311, using Sim2Real discriminator model(s) (e.g., stored in the Sim2Real and Real2Sim model(s) database 180 of FIG. 1) to determine whether the predicted real image 311 is truly a real image or a predicted real image generated by the Sim2Real generator 321. Based on this determination, a Sim2Real adversarial loss 322A can be generated and transmitted to loss engine 340A.

Further, perception engine 331 can process the predicted real image 311, using perception model(s) (e.g., stored in perception model(s) database 190 of FIG. 1), to generate predicted output(s) 331A. In some implementations, the perception engine 331 can utilize a perception model that is trained using mostly (or even exclusively) on real training instances, while in other implementations the perception engine 331 can utilize a perception model that is trained using mixed training instances as described above with respect to FIG. 1. The predicted output(s) 331A can be transmitted to the loss engine 340A. The loss engine 340A can compare the predicted output(s) 331A generated by the perception engine 331 to the ground truth output 301A determined by the simulator 301 when the simulated image 310 was generated. Based on the comparing, the loss engine 340A can determine a Sim2Real perception loss (e.g., as described in more detail with respect to FIG. 5). The loss engine 340A can process the Sim2Real perception loss (optionally along with the Sim2Real adversarial loss 322A), using one or more loss function (e.g., stored in loss function(s) database 195), to generate an update 340A1A. The update 340A1A can be backpropagated across the Sim2Real GAN model to update the Sim2Real model (e.g., the Sim2Real model utilized by the Sim2Real generator 321 of the Sim2Real GAN model of FIG. 3A).

Figure 3B:
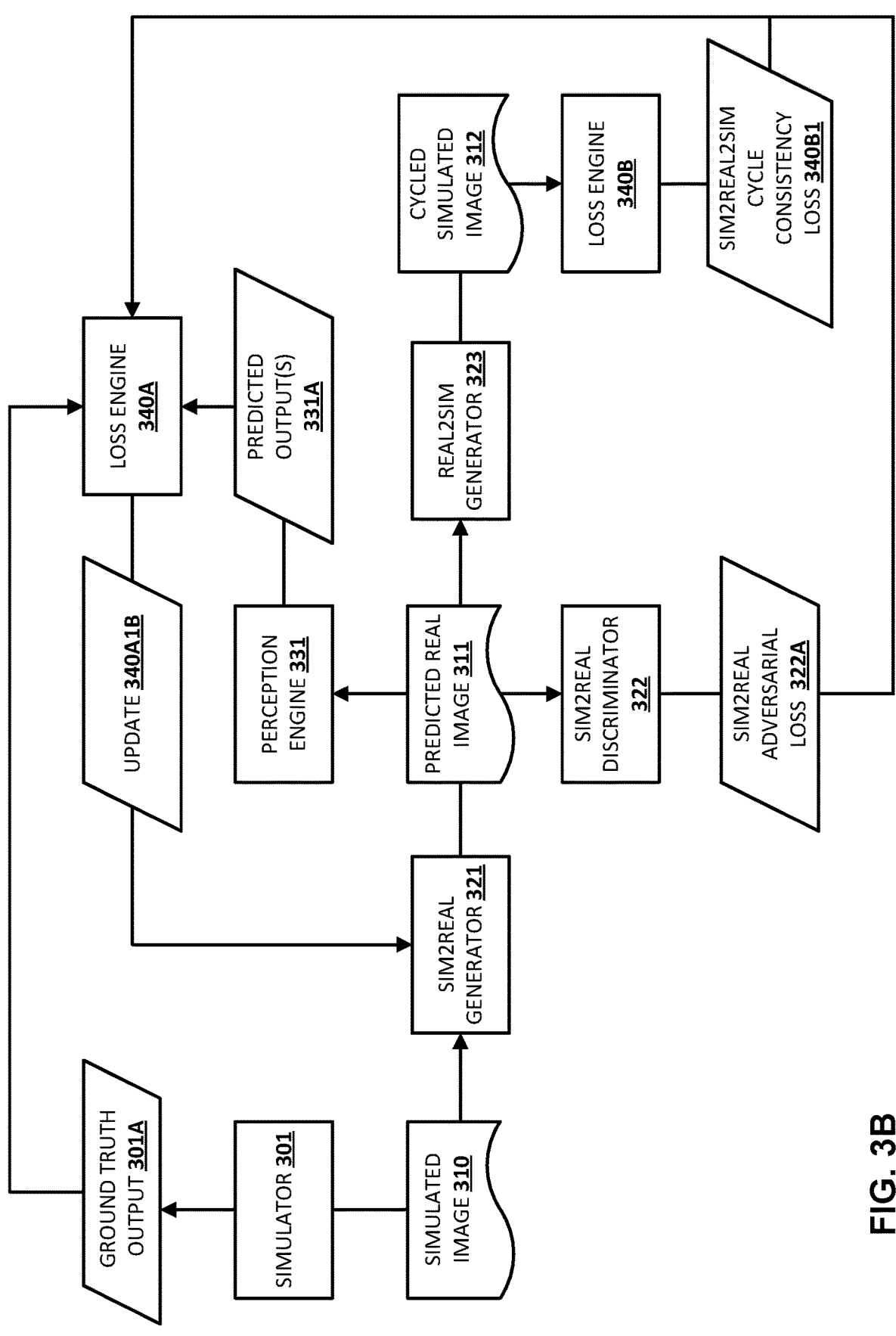
FIG. 3B is an example process flow of generating a perception loss, using a simulation-to-real-to-simulation cycle generative adversarial network model, for updating a simulation-to-real model, in accordance with various implementations disclosed herein.

In various implementations, additional or alternative loss(es) can also be utilized in generating updates to train the Sim2Real model. For example, as shown in FIG. 3B, an example process flow of generating a perception loss, using a simulation-to-real-to-simulation ("Sim2Real2Sim") cycle generative adversarial network model ("CycleGAN" model), for updating a Sim2Real model is depicted. The Sim2Real model can be, for example, a Sim2Real generator model of the Sim2Real2Sim CycleGAN model. Put another way, a real-to-simulation ("Real2Sim") GAN model can be combined with the Sim2Real GAN model of FIG. 3A, thereby resulting in the Sim2Real2Sim CycleGAN model depicted in FIG. 3B. Notably, the Sim2Real perception loss, the Sim2Real adversarial loss 322A, and the Real2Sim adversarial loss can be generated in the same manner described above with respect to FIG. 3A. Further, Real2Sim generator 323 can process the predicted real image 311, using Real2Sim generator model(s) (e.g., stored in the Sim2Real and Real2Sim model(s) database 180 of FIG. 1), to generate a cycled simulated image 312. Loss engine 340B can compare the cycled simulated image 312 and the simulated image 310 to generate Sim2Real2Sim cycle consistency loss 340B1. Notably, the loss engine 340B can be the same as the loss engine 340A, or a distinct loss engine as depicted in FIG. 3B. It should be noted that this should not be limiting, and that they are depicted as distinct loss engines in FIG. 3B for the sake of brevity. Accordingly, as depicted in FIG. 3B, the Sim2Real2Sim cycle consistency loss 340B1 can be transmitted to the loss engine 340A. The loss engine 340A can process the Sim2Real perception loss and the Sim2Real2Sim cycle consistency loss 440B1 (optionally along with the Sim2Real adversarial loss 322A), using one or more of the loss functions (e.g., stored in loss function(s) database 195), to generate an update 340A1B. The update 340A1B can be backpropagated across the Sim2Real2Sim CycleGAN model, thereby training the Sim2Real model (e.g., the Sim2Real model utilized by the Sim2Real generator 321 of the Sim2Real2Sim CycleGAN model of FIG. 3B).

Moreover, and although not depicted in FIG. 3B, a Real2Sim adversarial loss can also be generated using the Sim2Real2Sim CycleGAN model of FIG. 3B. A Real2Sim discriminator can process the cycled simulated image 312, using Real2Sim discriminator model(s) (e.g., stored in the Sim2Real and Real2Sim model(s) database 180 of FIG. 1) to determine whether the cycled simulated image 312 is truly a simulated image or a cycled simulated image generated by the Real2Sim generator 323. Based on this determination, the Real2Sim adversarial loss can be generated and transmitted to the loss engine 340A. The loss engine 340A can optionally utilize the Real2Sim adversarial loss in generating the update 340A1B to be backpropagated across the Sim2Real2Sim CycleGAN model.

Figure 3C:
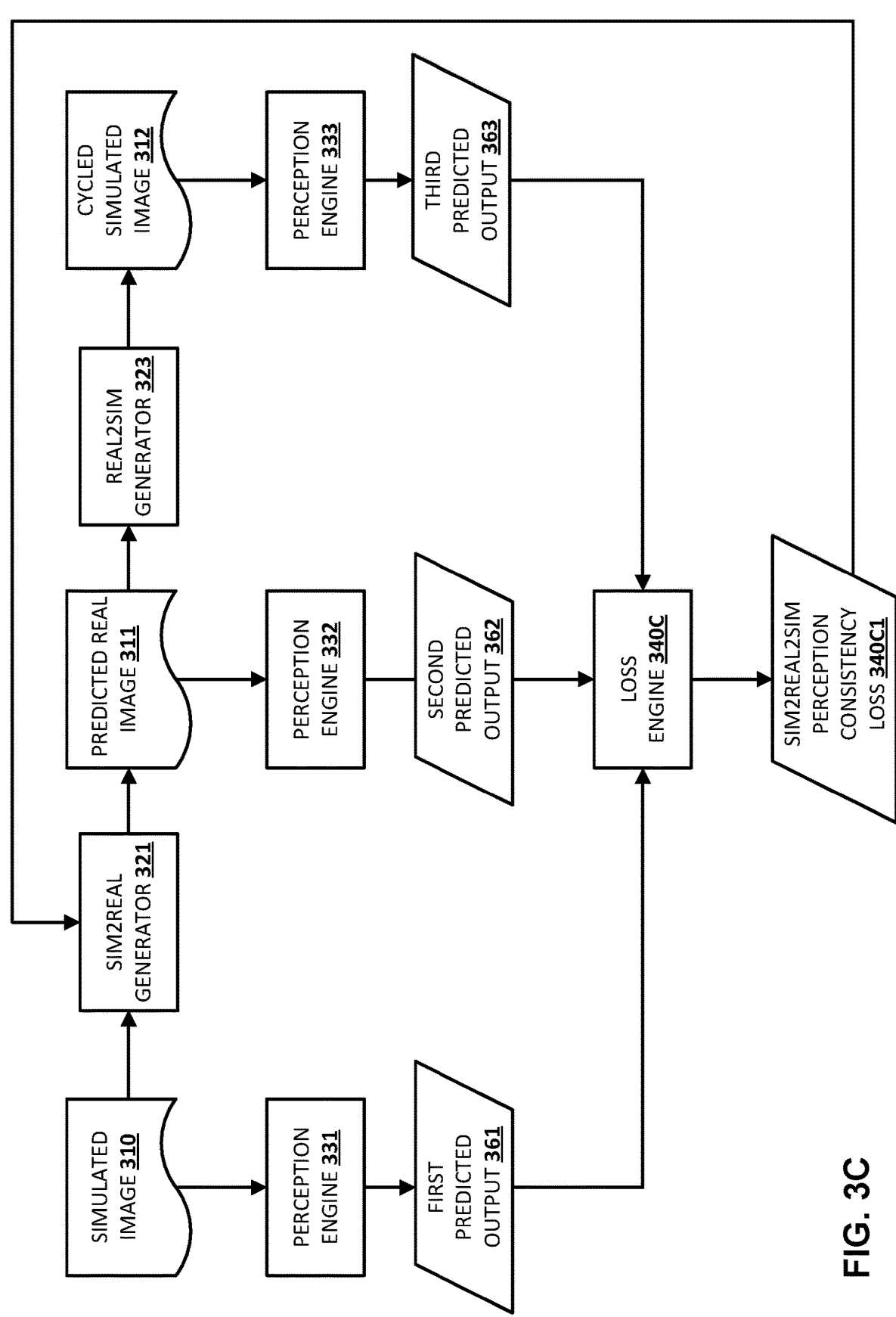
FIG. 3C is an example process flow of generating a perception consistency loss, using the simulation-to-real-to-simulation cycle generative adversarial network model of FIG. 3B, for updating a simulation-to-real model, in accordance with various implementations disclosed herein.

In various implementations, further additional or alternative loss(es) can also be utilized in generating updates to train the Sim2Real model. For example, as shown in FIG. 3C, an example process flow of generating a perception consistency loss, using the Sim2Real2Sim CycleGAN model of FIG. 3B, for updating a Sim2Real model is depicted. Notably, the Sim2Real perception loss, the Sim2Real adversarial loss 322A, the Real2Sim adversarial loss, and the Sim2Real2Sim cycle consistency loss 340B1 can be generated in the same manner described above with respect to FIGS. 3A and 3B. Further, the perception consistency loss can be generated based on the Sim2Real2Sim image triple that includes the simulated image 310, the predicted real image 311, and the cycled simulated image 312, and can be considered a Sim2Real2Sim perception consistency loss. Perception engine 331 can process, using perception model(s) (e.g., stored perception model(s) database 190 of FIG. 1), each of the images of the Sim2Real2Sim image triple to generate first predicted output 361 for the simulated image 310, second predicted output 362 for the predicted real image 311, and third predicted output 363 for the cycled simulated image 312. Notably, the perception engine 331 can generate these predicted outputs 361, 362, and/or 363 using a single perception model or distinct perception models. For example, the perception engine 331 can utilize a single perception model trained using mixed training instances as described above with respect to FIG. 1 to process each of the images of the Sim2Real2Sim image triple. As another example, the perception engine 331 can utilize a first perception model trained using simulated training examples as described above with respect to FIG. 1 to process the simulated image 310 and the cycled simulated image 312, and can utilize a second perception model trained using real training instances as described above with respect to FIG. 1 to process the predicted real image 311. In some versions of those implementations, and as described in more detail herein (e.g., with respect to FIG. 5), the first predicted output 361 may be utilized as ground truth output in FIGS. 3A and 3B, in addition to or in lieu of the ground truth output 301A of FIGS. 3A and 3B, for generating the Sim2Real perception loss.

Moreover, loss engine 340C can process the first predicted output 361, the second predicted output 362, and/or the third predicted output 363, using one or more of the loss functions (e.g., stored in loss function(s) database 195), to generate a Sim2Real2Sim perception consistency loss 340C1. More particularly, the loss engine 340C can generate the Sim2Real2Sim perception consistency loss 340C1 as a function of comparisons of the first predicted output 361, the second predicted output 362, and/or the third predicted output 363. For example, and as described in more detail below with respect to FIG. 5, the loss engine 340C can perform pairwise comparisons between each of the first predicted output 361, the second predicted output 362, and the third predicted output 363, and can generate the Sim2Real2Sim perception consistency loss 340C1 as a function of these pairwise comparisons. Notably, the loss engine 340C can be the same loss engine as the loss engines 340A and 340B depicted in FIGS. 3A and 3B, and the loss engine 340C is depicted as a distinct loss engine in FIG. 3C for the sake of brevity. The Sim2Real2Sim perception consistency loss 340C1 can be utilized, alone or in combination with one or more of the Sim2Real perception loss, the Sim2Real adversarial loss 322A, the Real2Sim adversarial loss, the Sim2Real2Sim cycle consistency loss 340B1, and/or other losses described herein, to generate an update that is backpropagated across the Sim2Real2Sim CycleGAN model of FIG. 3C, thereby training the Sim2Real model.

Figure 4A:
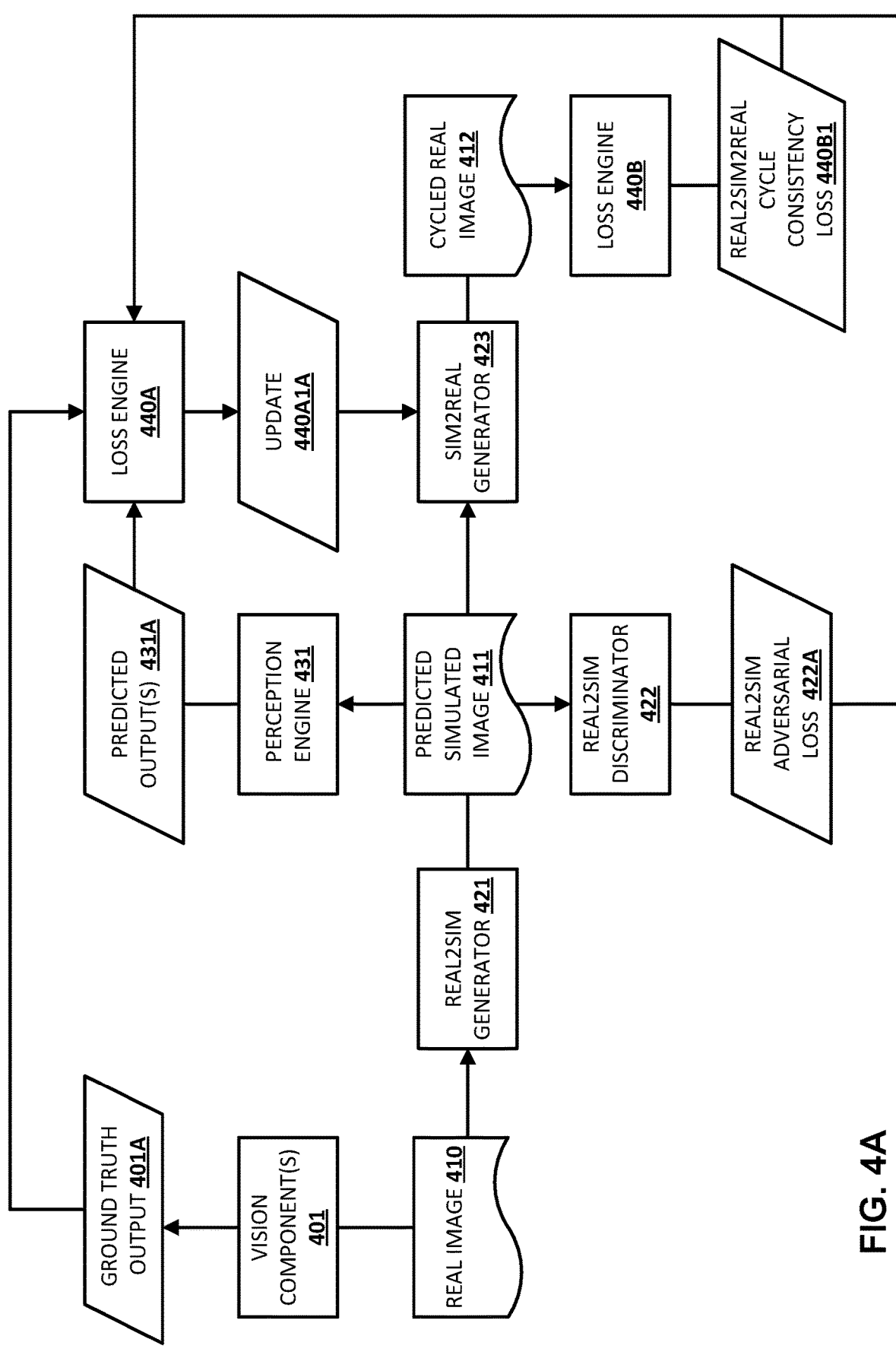
FIG. 4A is an example process flow of generating a perception loss, using a real-to-simulation-to-real cycle generative adversarial network model, for updating a simulation-to-real model, in accordance with various implementations disclosed herein.

Turning now to FIG. 4A, an example process flow of generating a perception loss, using a real-to-simulation-to-real ("Real2Sim2Real") cycle generative adversarial network ("CycleGAN" model), for updating a simulation-to-real model ("Sim2Real" model) is depicted. The process flow of FIG. 4A can be implemented using various components described above with respect to FIG. 1. In some implementations, a Real2Sim perception loss can be utilized in generating updates to train the Sim2Real model. The Sim2Real model can be, for example, a Sim2Real generator model of the Real2Sim2Real CycleGAN model. Vision component(s) 401 (e.g., vision component(s) 131 of robot 130 of FIG. 1 and/or other vision component(s)) can generate a real image 410. Real2Sim generator 421 can process the real image 410 (or a real image from other database(s)), using Real2Sim generator model(s) (e.g., stored in the Sim2Real and Real2Sim model(s) database 180 of FIG. 1) to generate a predicted simulated image 411. Real2Sim discriminator 422 can process the predicted simulated image 411, using Real2Sim discriminator model(s) (e.g., stored in the Sim2Real and Real2Sim model(s) database 180 of FIG. 1) to determine whether the predicted simulated image 411 is truly a simulated image or a predicted simulated image generated by the Real2Sim generator 421. Based on this determination, a Real2Sim adversarial loss 422A can be generated and transmitted to loss engine 440A.

Further, perception engine 431 can process the predicted simulated image 411, using perception model(s) (e.g., stored in the perception model(s) database 190 of FIG. 1), to generate predicted output(s) 431A. In some implementations, the perception engine 431 can utilize a perception model that is trained using mostly (or even exclusively) on simulated training instances, while in other implementations the perception engine 431 can utilize a perception model that is trained using mixed training instances as described above with respect to FIG. 1. The predicted output(s) 431A can be transmitted to the loss engine 440A. The loss engine 440A can compare the predicted output(s) 431A generated by the perception engine 431 to the ground truth output 401A assigned to the real image 410 when the real image 310 was captured. Based on the comparing, the loss engine 440A can determine a Real2Sim perception loss (e.g., as described in more detail with respect to FIG. 5).

Moreover, Sim2Real generator 423 can process the predicted simulated image 411, using Sim2Real generator model(s) (e.g., stored in the Sim2Real and Real2Sim model(s) database 180 of FIG. 1), to generate a cycled real image 412. Loss engine 440B can compare the cycled real image 412 and the real image 410 to generate Real2Sim2Real cycle consistency loss 440B1. Notably, the loss engine 440B can be the same as the loss engine 440A, or a distinct loss engine as depicted in FIG. 4A. It should be understood this is not meant to be limiting, and the loss engines are depicted as distinct loss engines in FIG. 4A for the sake of brevity. Accordingly, as depicted in FIG. 4, the Real2Sim2Real cycle consistency loss 440B1 can be transmitted to the loss engine 440A. The loss engine 440A can process the Sim2Real perception loss and the Real2Sim2Real cycle consistency loss 440B1 (optionally along with the Real2Sim adversarial loss 422A), using one or more of the loss functions (e.g., stored in loss function(s) database 195), to generate an update 440A1A. The update 440A1A can be backpropagated across the Real2Sim2Real CycleGAN model, thereby training the Sim2Real model (e.g., the Sim2Real model utilized by the Sim2Real generator 423 of the Real2Sim2Real CycleGAN model of FIG. 4).

Moreover, and although not depicted in FIG. 4A, a Sim2Real adversarial loss can also be generated using the Real2Sim2Real CycleGAN model of FIG. 4A. A Sim2Real discriminator can process the cycled real image 412, using Sim2Real discriminator model(s) (e.g., stored in the Sim2Real and Real2Sim model(s) database 180 of FIG. 1) to determine whether the cycled real image 412 is truly a real image or a cycled real image generated by the Sim2Real generator 423. Based on this determination, the Sim2Real adversarial loss can be generated and transmitted to loss engine 440A. The loss engine 440A can optionally utilize the Sim2Real adversarial loss in generating the update 440A1A to be backpropagated across the Real2Sim2Real CycleGAN model of FIG. 4A.

Figure 4B:
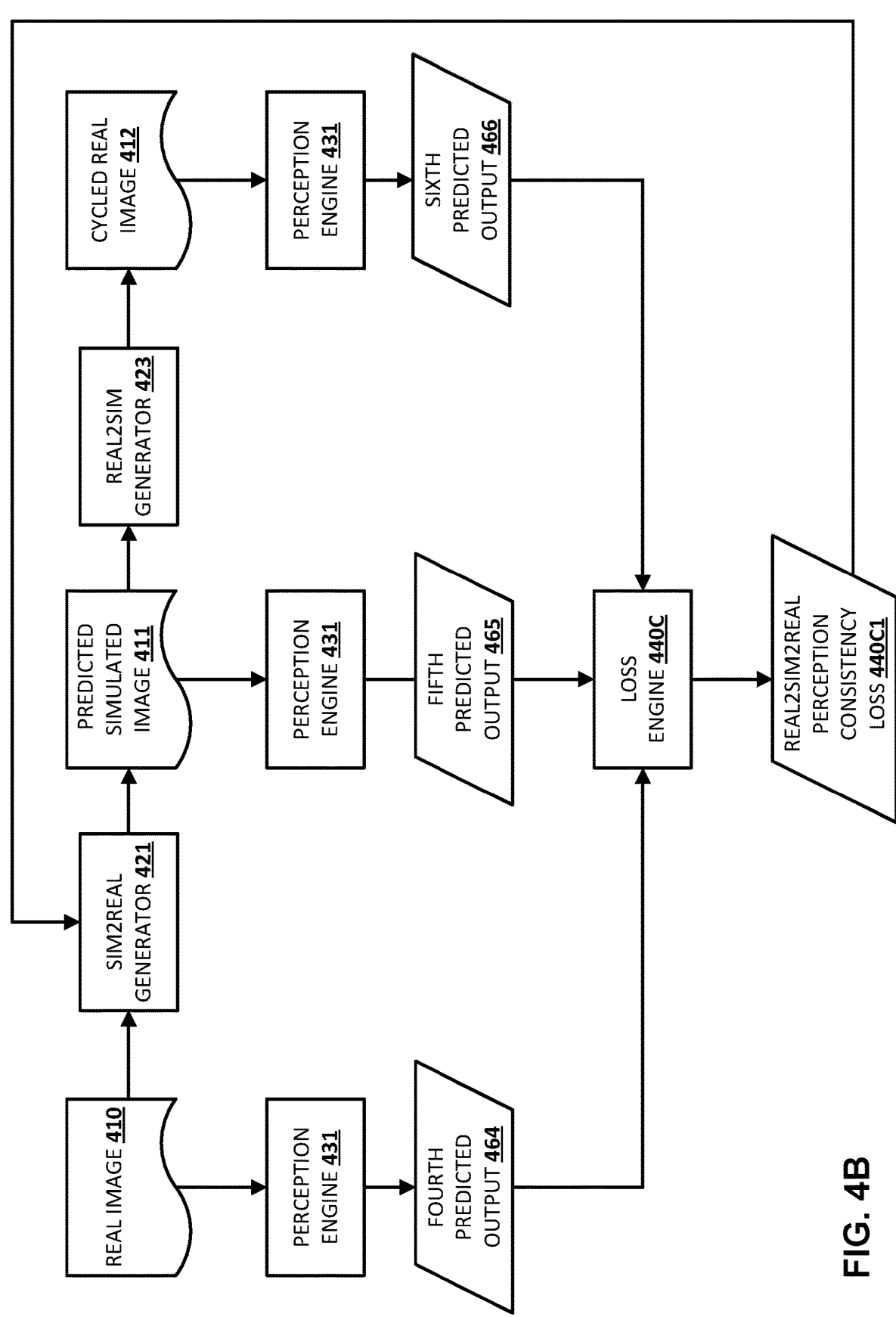
FIG. 4B is an example process flow of generating a perception consistency loss, using the real-to-simulation-to-real cycle generative adversarial network model of FIG. 4A, for updating a simulation-to-real model, in accordance with various implementations disclosed herein.

In various implementations, additional or alternative loss(es) can also be utilized in generating updates to train the Sim2Real model. For example, as shown in FIG. 4B, an example process flow of generating a perception consistency loss, using the Real2Sim2Real CycleGAN model of FIG. 4A, for updating a Sim2Real model is depicted. Notably, the Real2Sim perception loss, the Real2Sim adversarial loss 422A, the Sim2Real adversarial loss, and the Real2Sim2Real cycle consistency loss 440B1 can be generated in the same manner described above with respect to FIG. 4A. Further, the perception consistency loss can be generated based on the Real2Sim2Real image triple that includes the real image 410, the predicted simulated image 411, and the cycled real image 412, and can be considered a Real2Sim2Real perception consistency loss. Perception engine 431 can process, using perception model(s) (e.g., stored perception model(s) database 190 of FIG. 1), each of the images of the Real2Sim2Real image triple to generate fourth predicted output 464 for the real image 410, fifth predicted output 465 for the predicted simulated image 411, and sixth predicted output 463 for the cycled real image 412. Notably, the perception engine 431 can generate these predicted outputs 464, 465, and/or 466 using a single perception model or distinct perception models. For example, the perception engine 431 can utilize a single perception model trained using mixed training instances as described above with respect to FIG. 1 to process each of the images of the Real2Sim2Real image triple. As another example, the perception engine 431 can utilize a first perception model trained using real training examples as described above with respect to FIG. 1 to process the real image 410 and the cycled real image 412, and a second perception model trained using simulated training instances as described above with respect to FIG. 1 to process the predicted simulated image 411. In some versions of those implementations, and as described in more detail herein (e.g., with respect to FIG. 5), the fourth predicted output 464 may be utilized as ground truth output in FIG. 4A, in addition to or in lieu of the ground truth output 401A of FIG. 4A, for generating the Real2Sim perception loss.

Moreover, loss engine 440C can process the fourth predicted output 464, the fifth predicted output 465, and/or the sixth predicted output 466, using one or more of the loss functions (e.g., stored in loss function(s) database 195), to generate a Real2Sim2Real perception consistency loss 440C1. More particularly, the loss engine 440C can generate the Real2Sim2Real perception consistency loss 440C1 as a function of comparisons of the fourth predicted output 464, the fifth predicted output 465, and/or the sixth predicted output 466. For example, and as described in more detail below with respect to FIG. 5, the loss engine 440C can perform pairwise comparisons between each of the fourth predicted output 464, the fifth predicted output 465, and the sixth predicted output 466, and can generate the Real2Sim2Real perception consistency loss 440C1 as a function of these pairwise comparisons. Notably, the loss engine 440C can be the same loss engine as the loss engines 440A and 440B depicted in FIG. 4A and is depicted as a distinct loss engine in FIG. 4B for the sake of brevity. The Real2Sim2Real perception consistency loss 440C1 can be utilized, alone or in combination with one or more of the Real2Sim perception loss, the Real2Sim adversarial loss 422A, the Sim2Real adversarial loss, the Real2Sim2Real cycle consistency loss 440B1, and/or other losses described herein, to generate an update that is backpropagated across the Real2Sim2Real CycleGAN model of FIG. 4B, thereby training the Sim2Real model.

Notably, the process flows of FIGS. 3A, 3B, 3C, 4A, and 4B can be implemented by a robot (e.g., robot 130 of FIG. 1, robot 820 of FIG. 8, and/or other robots) various computing systems and/or devices (e.g., computing device 910 of FIG. 9) using the training system of FIG. 1. Although the updating of the Sim2Real model in FIGS. 3A, 3B, 3C, 4A, and 4B is described as being generated using particular losses, it should be understood that is for the sake of example, and is not meant to be limiting. For example, the losses utilized in generating the updates for Sim2Real model can be any one of, or any combination of, the losses described herein. As another example, particular losses can be selected utilized in generating the various updates described herein, thereby allowing the Sim2Real model to be tuned using the particular losses.

Moreover, it should be noted that the Sim2Real model utilized by the Sim2Real generator 321, 423 of FIGS. 3A, 3B, 3C, 4A, and 4B can be the same Sim2Real model. For example, multiple iterations the process flows of FIGS. 3A, 3B, 3C, 4A, and 4B can be performed in parallel using the same Sim2Real model. In these examples, a single update can be generated by the loss engines 340A, 440A based on the losses generated using each of the respective GAN and/or CycleGAN models of FIGS. 3A, 3B, 3C, 4A, and 4B. In other examples, a given one of the process flows of FIGS. 3A, 3B, 3C, 4A, and 4B can be performed sequentially using the same Sim2Real model. Further, once the Sim2Real model is trained, it can be utilized to generate simulated training data, and various other machine learning models can be trained using the simulated training data. These machine learning models can be employed by robots and/or other systems, and/or used to generate robotic control policies to control real robots.

Turning now to FIG. 5, example images annotated with various features are depicted. For the sake of example, assume a first image 510 of the images depicted in FIG. 5 is a simulated image generated by a simulator (e.g., simulator 152 of FIG. 1). Notably, the first image 510 includes a water bottle object and a soda can object, and various features thereof. Each of these objects in the first image 510 can be associated with ground truth output as described below. As shown in the first image 510 of FIG. 5, the water bottle object is associated with a ground truth bounding area 511 that is a defined by a first height H1 and first width W1 having a center of X1,Y1 (e.g., pixel location at X1,Y1). Further, the water bottle object depicted in the first image 510 can be associated with a ground truth probability for the water bottle object (e.g., 1.0). Moreover, the water bottle object depicted in the first image 510 can also be associated with a ground truth orientation for the water bottle object (e.g., 120° with respect to an x-axis, 30° with respect to a y-axis, and/or other representations of orientation). As also shown in the first image 510 of FIG. 5, the soda can object is associated with a ground truth bounding area 512 that is a defined by a second height H2 and second width W2 having a center of X2,Y2 (e.g., pixel location at X2,Y2). Further, the soda can object depicted in the first image 510 can be associated with a ground truth probability for the soda can object (e.g., 1.0). Moreover, the soda can object depicted in the first image 510 can also be associated with a ground truth orientation for the soda can object (e.g., 60° with respect to an x-axis, −30° with respect to a y-axis, and/or other representations of orientation).

As used herein, the term "ground truth output" refers to some baseline data to which other data can be compared. In some implementations, the ground truth output for a simulated image (e.g., the first image 510 of FIG. 5) can be determined by the simulator when the simulated image is generated by the simulator. In some additional and/or alternative implementations, the ground truth output for a simulated image (e.g., the first image 510 of FIG. 5) can be determined based on processing the simulated image, using perception model(s) (e.g., stored in perception model(s) database 190 of FIG. 1), to generate predicted output. Although this predicted output for the simulated image is generated using the perception model(s), it is quasi-ground truth output to which other predicted outputs can be compared (e.g., predicted outputs corresponding to a predicted real image and/or a cycled simulated image) and is also referred to herein as "ground truth output" for the sake of brevity. In some implementations, the ground truth output for a real image can be assigned to the real image by human reviewer(s) when the real image is captured by vision component(s). In some additional and/or alternative implementations, the ground truth output for a real image can be determined based on processing the real image, using perception model(s) (e.g., stored in perception model(s) database 190 of FIG. 1), to generate predicted output. Although this predicted output for the real image is generated using the perception model(s), it is quasi-ground truth output to which other predicted outputs can be compared (e.g., predicted outputs corresponding to a predicted simulated image and/or a cycled real image) and is also referred to herein as "ground truth output" for the sake of brevity.

In some implementations, a simulation-to-real perception loss can be generated based on comparing the generated predicted output(s) associated with a second image 550 with ground truth output associated with the first image 510. The simulation-to-real perception loss can be utilized to update the simulation-to-real generator model. The first image 510 can be processed, using a simulation-to-real generator model (e.g., as described above with respect to FIGS. 3A, 3B, and 3C), to generate the second image 550. The second image 550 is a predicted real image that corresponds to the first image 510. Accordingly, there should be little to no variance between the first image 510 and the second image 520. The second image 550 can be processed, using perception model(s), to generate predicted output(s) for the second image 550. The predicted output(s) generated by the perception model(s) can include, for example, one or more predicted bounding areas each corresponding to a respective object captured in the second image 550. The predicted output(s) generated by the perception model(s) can additionally or alternatively include, for each object or predicted bounding area, one or more corresponding predicted probabilities that are each indicative of a respective object classification of the object included in the predicted bounding area(s).

As shown in the second image 550 of FIG. 5, the water bottle object is associated with a predicted bounding area 551 that is a defined by a third height H3 and third width W3 having a center of X3,Y3 (e.g., pixel location at X3,Y3). Further, the water bottle object depicted in the second image 550 can be associated with a predicted probability for the water bottle object (e.g., 0.7). Moreover, the water bottle object depicted in the second image 550 can also be associated with a predicted orientation for the water bottle object (e.g., 130° with respect to an x-axis, 40° with respect to a y-axis, and/or other representations of orientation). As also shown in the second image 550 of FIG. 5, the soda can object is associated with a predicted bounding area 552 that is a defined by a fourth height H4 and fourth width W4 having a center of X4,Y4 (e.g., pixel location at X4,Y4). Further, the soda can object depicted in the second image 550 can be associated with a predicted probability for the soda can object (e.g., 0.6). Moreover, the soda can object depicted in the second image 550 can also be associated with a predicted orientation for the soda can object (e.g., 90° with respect to an x-axis, 0° with respect to a y-axis, and/or other representations of orientation).

In implementations where the predicted output(s) include the predicted bounding area(s), the simulation-to-real perception loss can be generated based on comparing one or more features of the predicted bounding area(s) 551, 552 (e.g., the size, center point, orientation, and/or other features) of the second image 550 to corresponding features of ground truth bounding area(s) 511, 512 of the first image 510. For example, the size of the water bottle object in the first image 510 (i.e., defined by the first height H1 and the first width) can be compared to the size of the water bottle object in the second image 550 (i.e., defined by the third height H3 and the third width W3), and the simulation-to-real perception loss can be generated based on a difference in the size of the water bottle object in the first image 510 and the second image 550. As another example, the location of the center of the water bottle object in the first image 510 (i.e., defined by the location X1,Y1) can be compared to the center of the water bottle object in the second image 550 (i.e., defined by the location X3,Y3), and the simulation-to-real perception loss can be generated based on a difference in the location of the center of the water bottle object in the first image 510 and the second image 550. As yet another example, the orientation of the water bottle object in the first image 510 (i.e., 120° with respect to an x-axis, 30° with respect to a y-axis, and/or other representations of orientation) can be compared to the orientation of the water bottle object in the second image 550 (i.e., 130° with respect to an x-axis, 40° with respect to a y-axis, and/or other representations of orientation), and the simulation-to-real perception loss can be generated based on a difference in the orientation of the water bottle object in the first image 510 and the second image 550. Additionally or alternatively, the simulation-to-real perception loss can also be generated based on similar comparisons for the soda can object.

In additional and/or alternative implementations where the predicted output(s) include, for each object or predicted bounding area, one or more corresponding predicted probabilities that are each indicative of a respective object classification of the object included in the predicted bounding area(s), the simulation-to-real perception loss can be generated based on comparing the predicted probabilities of the objects of the second image 550 to ground truth probabilities of the objects of the first image 510. For example, if the predicted probability for the soda can object is 0.6, then the simulation-to-real perception loss can be generated based on comparing the predicted probability of 0.6 for the soda can object to the ground truth probability of 1.0 for the soda can object. Additionally or alternatively, the simulation-to-real perception loss can also be generated based on similar comparisons for the water bottle object. In some versions of those implementations, the comparing can be based on probability distributions. For example, if the perception model(s) generate a probability distribution of [0.6, 0.4] for the soda can object corresponding to objects of [soda can, water bottle], then the generated probability distribution can be compared to a ground truth probability distribution of [1.0, 0.0], and the simulation-to-real perception loss can be generated based on the comparing of the probability distributions.

In various implementations, a simulation-to-real-to-simulation perception consistency loss can also be generated. The simulation-to-real-to-simulation perception consistency loss can additionally or alternatively be utilized to update the simulation-to-real generator model. The first image 510 can be processed, using a simulation-to-real generator model, to generate the second image 550, and the second image can be processed, using a real-to-simulation generator model to generate a third image that is a cycled simulated image corresponding to the first image 510 (e.g., as described above with respect to FIGS. 3A, 3B, and 3C). Notably, these images form a simulation-to-real-to-simulation image triple, and there should be little to no variance between these images. Each of the first image 510, the second image 550, and the cycled simulated image can be processed, using perception model(s) (e.g., stored in perception model(s) database 190 of FIG. 1), to generate predicted output(s), and the predicted output(s) for the first image 510 can be utilized as the ground truth output. The simulation-to-real-to-simulation perception consistency loss can be generated by performing pairwise comparisons between the predicted outputs (e.g., predicted bounding areas or features thereof, and/or predicted probabilities as described above) for each of the images. For example, assume that the bounding area 511 of the water bottle object is a predicted bounding area determined by processing the first image 510 using the perception model. In this example, the bounding area 511 can be utilized as ground truth output as noted above, and can be compared with the predicted bounding 551 of the second image 550 and can be compared with an additional predicted bounding area for the water bottle object in the cycled simulated image (not depicted). Based on these comparisons, the simulation-to-real-to-simulation perception consistency loss can be generated. Moreover, the predicted bounding area 551 of the second image 550 can optionally be compared with the additional predicted bounding area for the water bottle object in the cycled image, and this comparison can also be utilized to generate the simulation-to-real-to-simulation perception consistency loss. Although the above example for generating the simulation-to-real-to-simulation is described with respect to predicting bounding areas, it should be understood that it is provided as a non-limiting example, and that other predicted output(s) generated by the perception model(s) for the first image 510, the second image 550, and the cycled simulated image can also be compared to generate the simulation-to-real-to-simulation perception consistency loss.

Moreover, although FIG. 5 is described herein as the first image 510 being the simulated image and the second image 550 being the predicted real image, and a third image (not depicted) being a cycled simulated image of the first image 510, it should be understood that is solely for the sake of example and is not meant to be limiting. For example, the first image 510 can be a real image captured by vision component(s), the second image 550 can be a predicted simulated image that is generated by processing the first image 510 using a real-to-simulation generator model, and the third image can be a cycled real image that is generated by processing the second image 550 using a simulation-to-real generator model. In this example, the images can be similarly processed using the perception models. However, in this example, a real-to-simulation perception loss and/or a real-to-simulation-to-real perception consistency loss can be generated based on comparing the generated predicted output(s) associated with the second image 550 and the third image with ground truth output associated with the first image 510.

Turning now to the drawings, FIG. 6 is a flowchart illustrating an example method 600 of training a simulation-to-real model using loss(es) generated by a simulation-to-real-to-simulation cycle generative adversarial network model according to various implementations disclosed herein. For convenience, the operations of the flowchart are described with reference to a system that performs the operations. This system may include one or more processors (e.g., processor(s) 914 of FIG. 9). While operations of the method 600 are shown in a particular order, it should be understood that is for the sake of example and is not meant to be limiting. For example, one or more operations of the method 600 may be reordered, omitted, or added.

At block 652, the system processes a simulated image, using a simulation-to-real generator model, to generate a predicted real image. The predicted real image corresponds to the simulated image and should represent a same environment depicted in the simulated image. The simulated image can be generated, for example, using a simulator (e.g., simulator 152 of FIG. 1) that is configured to generate simulated images that have randomized parameters. The randomized parameters can include, for example, various disparate objects of disparate classes to be included in an environment of the simulated images, lighting intensity of the environment, textures of the objects in the environment, pose(s) of the objects in the environment, and/or other randomized styles and/or semantics of the simulated images. Further the simulation-to-real generator model can be a generator model of GAN model(s) and/or CycleGAN model(s) as described in more detail above (e.g., with respect to FIGS. 3A and 3B).

At block 654, the system processes the predicted real image, using perception model(s), to generate predicted output(s). The predicted output(s) generated using the perception model(s) can include, for example, predicted bounding area(s) of object(s) included in the predicted real image, predicted probability(s) of a classification of the object(s) included in the predicted real image, and/or other output the perception model(s) are trained to predict. The predicted output(s) described in greater detail herein (e.g., with respect to FIG. 5). In some implementations, a single perception model can generate the predicted output(s) based on processing predicted real images and predicted simulated images. In some additional and/or alternative implementations, a first perception model can be utilized to generate the predicted output(s) based on processing predicted real images, and a second perception model can be utilized to generate the predicted output(s) based on processing predicted simulated images.

At block 656, the system generates a simulation-to-real perception loss based on comparing the predicted output(s) to ground truth output for the simulated image. The ground truth output for the simulated image can be determined from the simulator utilized to generate the simulated image. As one non-limiting example, if the predicted output indicate that a center of a predicted bounding area in the predicted real image (e.g., X2, Y2), then the system can compare the center of the predicted bounding area of to a center of a ground truth bounding area of the object in the simulated image (e.g., X1,Y1). The perception loss can be generated based on a difference between the center of the predicted bounding area and the center of the ground truth bounding area. Comparing the predicted output(s) to the ground truth output(s) is described in greater detail herein (e.g., with respect to FIG. 5). In some implementations, the simulation-to-real generator model may only be updated based on the simulation-to-real perception loss as indicated by the arrow from block 656 to block 666 without considering any additional loss(es).

At block 658, the system processes the predicted real image, using a simulation-to-real discriminator model, to determine whether the predicted real image is an actual real image or the predicted real image. The simulation-to-real discriminator model can be a discriminator model of GAN model(s) and/or CycleGAN model(s) as described in more detail above (e.g., with respect to FIGS. 3A, 3B, and 3C). In some implementations, the simulation-to-real discriminator model can determine a predicted probability associated with whether the predicted real image is the actual real image or the predicted real image. For example, the simulation-to-real discriminator model can determine a first predicted probability of 0.6 associated with the predicted real image being the predicted real image and a second predicted probability of 0.4 associated with the predicted real image being the actual real image.

At block 660, the system generates a simulated-to-real adversarial loss based on determining whether the predicted real image is the actual real image or the predicted real image. In some implementations, the simulated-to-real adversarial loss can be generated by comparing output generated using the simulation-to-real discriminator model to ground truth output. Continuing with the above example, the simulated-to-real adversarial loss can be generate by comparing the first predicted probability of 0.6 to a ground truth probability of 1.0. In some implementations, the simulation-to-real generator model may only be updated based on the simulation-to-real perception loss and the simulation-to-real adversarial loss as indicated by the arrow from block 660 to block 666 without considering any further additional loss(es).

At block 662, the system processes the predicted real image, using a real-to-simulation generator model, to generate a cycled simulated image. The simulated image, the predicted real image, and the cycled simulated image can be considered an image triple. Put another way, each of the images in the image triple represent the same environment, and there should be little to no variance in the images of the image triple. The real-to-simulation generator model can be a portion of CycleGAN model(s) as described in more detail above (e.g., with respect to FIG. 3B).

At block 664, the system generates a simulation-to-real-to-simulation cycle consistency loss based on comparing the simulated image and the cycled simulated image. As noted above, there should be little to no variance in the images of the image triple. Accordingly, the simulated image and the cycled simulated image should include the same attributes.

At block 666, the system updates the simulation-to-real generator model based on one or more of: the simulation-to-real perception loss generated at block 656, the generated simulation-to-real adversarial loss generated at block 660, or the generated simulation-to-real-to-simulation cycle consistency loss generated at block 664. The system can update the simulation-to-real generator model using any one of the above losses alone, and/or any combination of the above losses. A loss function can be applied to the loss(es) utilized to generate the update, and the update can be backpropagated across the simulation-to-real generator model, thereby updating weights of the simulation-to-real generator model.

At block 668, the system determines whether the simulation-to-real generator model should be further trained. The system can determine that the simulation-to-real generator model should be further trained based on, for example, whether additional simulation image(s) exist for training the simulation-to-real generator model (i.e., additional simulated image(s) stored in simulated image(s) database 170 of FIG. 1), whether a threshold number of iterations of training have been performed (e.g., 500 training iteration, 1000 training iterations, and so on), whether a threshold error has been reached (e.g., perception loss and/or other loss(es) minimized below a certain threshold error), and/or other metrics for determining whether to further train the simulation-to-real generator model. If, at an iteration of block 668, the system determines to further train the simulation-to-real generator model, the system can return to block 652 to process an additional simulated image, and continue with the method 600 as described above. If, at an iteration of block 668, the system determines no further training of the simulation-to-real generator model is needed, then the system may proceed to block 670 and the method 600 ends.

Figure 7:
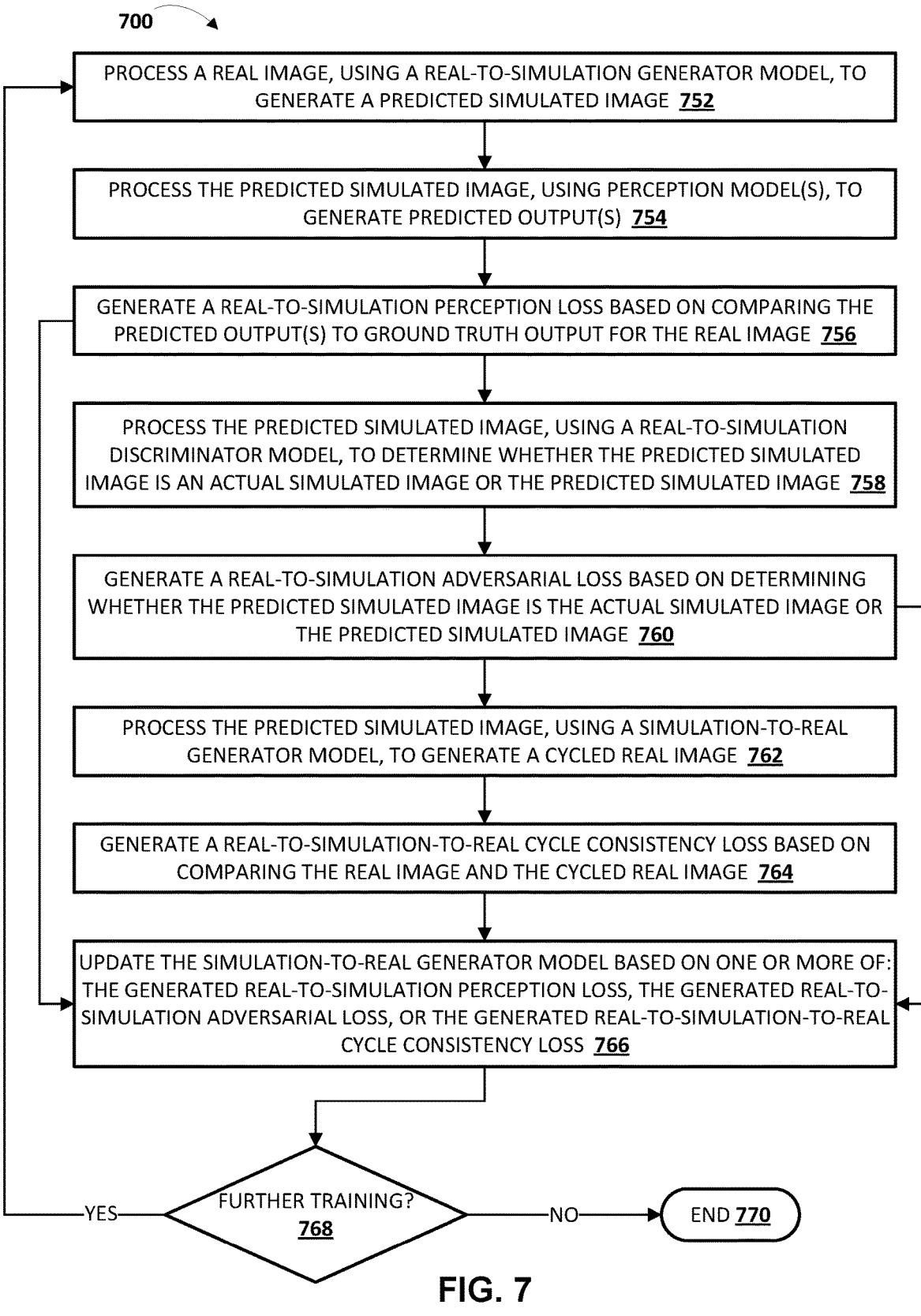
FIG. 7 is a flowchart illustrating an example method of training a simulation-to-real model using loss(es) generated by a real-to-simulation-to-real cycle generative adversarial network model, in accordance with various implementations disclosed herein.

Turning now to the drawings, FIG. 7 is a flowchart illustrating an example method 700 of training a simulation-to-real model using loss(es) generated by a real-to-simulation-to-real cycle generative adversarial network model according to various implementations disclosed herein. For convenience, the operations of the flowchart are described with reference to a system that performs the operations. This system may include one or more processors (e.g., processor(s) 914 of FIG. 9). While operations of the method 700 are shown in a particular order, it should be understood that is for the sake of example and is not meant to be limiting. For example, one or more operations of the method 700 may be reordered, omitted, or added.

At block 752, the system processes a real image, using a real-to-simulation generator model, to generate a predicted simulated image. The real image can be captured by one or more vision component(s). The vision component(s) can be vision component(s) of robot(s) and/or other vision component(s) that are independent of the robot(s).

At block 754, the system process the predicted simulated image, using perception model(s), to generate predicted output(s). The predicted output(s) generated using the perception model(s) can include, for example, predicted bounding area(s) of object(s) included in the predicted simulated image, predicted probability(s) of a classification of the object(s) included in the predicted simulated image, and/or other output the perception model(s) are trained to predict. The predicted output(s) described in greater detail herein (e.g., with respect to FIG. 5). In some implementations, a single perception model can generate the predicted output(s) based on processing predicted real images and predicted simulated images. In some additional and/or alternative implementations, a first perception model can be utilized to generate the predicted output(s) based on processing predicted real images, and a second perception model can be utilized to generate the predicted output(s) based on processing predicted simulated images.

At block 756, the system generates a real-to-simulation perception loss based on comparing the predicted output to ground truth output for the real image. The ground truth output for the simulated image can be determined from label(s) assigned to the real image captured by the vision component(s). As one non-limiting example, if the predicted output(s) indicate that a classification of an object included in the predicted simulated image is a water bottle with a predicted probability of 0.7 (and assuming that the object is in fact a water bottle), then the system can compare the predicted probability of 0.7 to ground truth probability of 1.0. The perception loss can be generated based on a difference between the predicted probability and the ground truth probability. Comparing the predicted output(s) to the ground truth output(s) is described in greater detail herein (e.g., with respect to FIG. 5). In some implementations, the simulation-to-real generator model may only be updated based on the real-to-simulation perception loss as indicated by the arrow from block 756 to block 766 without considering any additional loss(es).

At block 758, the system processes the predicted simulated image, using a real-to-simulation discriminator model, to determine whether the predicted simulated image is an actual simulated image or the predicted simulated image. The real-to-simulation discriminator model can be a discriminator model of GAN model(s) and/or CycleGAN model(s) as described in more detail above (e.g., with respect to FIG. 4). In some implementations, the real-to-simulation discriminator model can determine one or more corresponding predicted probabilities associated with whether the predicted simulated image is the actual simulated image or the predicted simulated image. For example, the real-to-simulation discriminator model can determine a first probability of 0.65 associated with the predicted simulated image being the predicted simulated image and a second probability of 0.35 associated with the predicted simulated image being the actual simulated image.

At block 760, the system generates a real-to-simulation adversarial loss based on determining whether the predicted simulated image is the actual simulated image or the predicted simulated image. In some implementations, the real-to-simulation adversarial loss can be generated by comparing output generated using the real-to-simulation discriminator model to ground truth output. Continuing with the above example, the real-to-simulation adversarial loss can be generate by comparing the first predicted probability of 0.65 to a ground truth probability of 1.0. In some implementations, the simulation-to-real generator model may only be updated based on the real-to-simulation perception loss and the real-to-simulation adversarial loss as indicated by the arrow from block 760 to block 766 without considering any further additional loss(es). In other implementations, the system may not generate the real-to-simulation adversarial loss. In some versions of those implementations, block 760 may be omitted, and the system may proceed directly from block 756 to block 762.

At block 762, the system processes the predicted simulated image, using a simulation-to-real generator model, to generate a cycled real image. Similar to the image triple described above with respect to block 662 of FIG. 6, the real image, the predicted simulated image, and the cycled real image can also be considered an image triple. Put another way, each of the images in the image triple represent the same environment, and there should be little to no variance in the images of the image triple. The simulation-to-real generator model can be a portion of CycleGAN model(s) as described in more detail above (e.g., with respect to FIG. 4).

At block 764, the system generates a real-to-simulation-to-real cycle consistency loss based on comparing the real image and the cycled real image. As noted above, there should be little to no variance in the images of the image triple. Accordingly, the real image and the cycled real image should include the same attributes.

At block 766, the system updates the simulation-to-real generator model based on one or more of: the real-to-simulation perception loss generated at block 756, the generated real-to-simulation adversarial loss generated at block 660, or the generated real-to-simulation-to-real cycle consistency loss generated at block 764. The system can update the simulation-to-real generator model using any one of the above losses alone, and/or any combination of the above losses. A loss function can be applied to the loss(es) utilized to generate the update, and the update can be backpropagated across the simulation-to-real generator model, thereby updating weights of the simulation-to-real generator model.

At block 768, the system determines whether the simulation-to-real generator model should be further trained. The system can determine that the simulation-to-real generator model should be further trained based on, for example, whether additional real image(s) exist for training the simulation-to-real generator model (i.e., captured by one or more vision component(s)), whether a threshold number of iterations of training have been performed (e.g., 500 training iteration, 1000 training iterations, and so on), whether a threshold error has been reached (e.g., perception loss and/or other loss(es) minimized below a certain threshold error), and/or other metrics for determining whether to further train the simulation-to-real generator model. If, at an iteration of block 768, the system determines to further train the simulation-to-real generator model, the system can return to block 752 to process an additional real image, and continue with the method 700 as described above. If, at an iteration of block 768, the system determines no further training of the simulation-to-real generator model is needed, then the system may proceed to block 770 and the method 700 ends.

Although the simulation-to-real generator model of the method 600 of FIG. 6 and the method 700 of FIG. 7 is described above as being updated based on various losses, it should be understood that is for the sake of example and is not meant to be limiting. For example, the simulation-to-real generator model may only be updated based on the simulation-to-real perception loss generated at block 656 of FIG. 6 in some implementations, whereas in other implementations, the simulation-to-real generator model may be updated based on any combination and/or subset of losses described in the method 600 of FIG. 6 and the method 700 of FIG. 7. Further, it should be understood that the loss(es) can be weighted using a loss function as described above (e.g., with respect to loss engine(s) 160 of FIG. 1). The weighted loss(es) from the loss function can then be backpropagated across the simulation-to-real generator model to update one or more weights of the simulation-to-real generator model. Moreover, it should be understood that the method 600 of FIG. 6 and the method 700 of FIG. 7 can be performed in parallel, and the loss(es) generated using the operations of the method 600 of FIG. 6 and the method 700 of FIG. 7 can be combined using a single loss function. Further, it should also been understood that the simulation-to-real generator model and the real-to simulator generator model discussed in connection with the method 600 of FIG. 6 and the method 700 of FIG. 7 can be the models and/or disparate models.

By training the simulation-to-real model based on the generated perception loss(es) from both simulation model, the reality gap can be mitigated since the simulation-to-real generator model is trained to generate predicted real images that preserve attributes (e.g., styles, such as lighting, textures, and/or other styles, and/or semantics, such as objects, object pose(s), and/or other semantics, of the environment) that are relevant at least to perception of objects (e.g., identifying, recognizing, and/or classifying the objects). The trained simulation-to-real generator model can then be utilized to generate robotic control policies that are generated using simulated data (e.g., trained based on predicted real images generated using simulated data and the trained simulation-to-real generator model), and that more accurately reflect real world environments. Accordingly, performance of the simulation-to-real generator model is improved at least in that the reality gap, for predicted real images generated using the simulation-to-real generator model, is mitigated. Further, the trained simulation-to-real generator model can be subsequently utilized in generating further predicted real images, from simulated data, and those predicted real images utilized in training additional machine learning model(s), such as models that represent robotic control policies for use on a real robot. Moreover, due to the mitigated reality gap from the simulation-to-real generator model, the generated predicted real images can lead to those additional machine learning model(s) being trained more efficiently (e.g., with less training data) and/or to being more robust (e.g., when deployed on robots) once trained.

Figure 8:
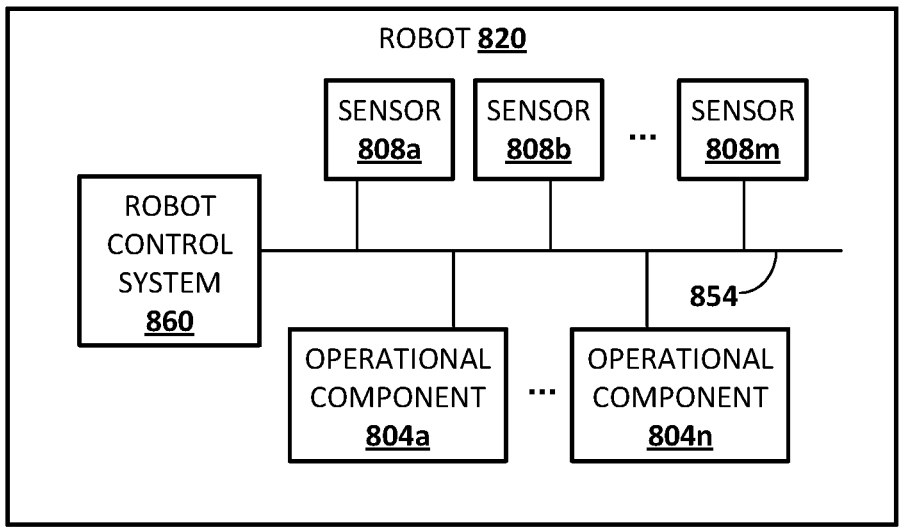
FIG. 8 schematically depicts an example architecture of a robot, in accordance with various implementations disclosed herein.

Turning now to FIG. 8, an example architecture of a robot 820 to perform one or more aspects of techniques described herein is depicted. The robot 820 includes a robot control system 860, one or more operational components 804*a-n*, and one or more sensors 808*a-m*. The sensors 808*a-m* may include, for example, vision sensors (e.g., camera(s), 3D scanners), light sensors, pressure sensors, positional sensors, pressure wave sensors (e.g., microphones), proximity sensors, accelerometers, gyroscopes, thermometers, barometers, and so forth. While sensors 808*a-m* are depicted as being integral with robot 820, this is not meant to be limiting. In some implementations, sensors 808*a-m* may be located external to robot 820, e.g., as standalone units.

Operational components 804*a-n* may include, for example, one or more end effectors (e.g., grasping end effectors) and/or one or more servo motors or other actuators to effectuate movement of one or more components of the robot. For example, the robot 820 may have multiple degrees of freedom and each of the actuators may control actuation of the robot 820 within one or more of the degrees of freedom responsive to control commands provided by the robot control system 860 (e.g., torque and/or other commands generated based on a control policy). As used herein, the term actuator encompasses a mechanical or electrical device that creates motion (e.g., a motor), in addition to any driver(s) that may be associated with the actuator and that translate received control commands into one or more signals for driving the actuator. Accordingly, providing a control command to an actuator may comprise providing the control command to a driver that translates the control command into appropriate signals for driving an electrical or mechanical device to create desired motion.

The robot control system 860 may be implemented in one or more processors, such as a CPU, GPU, and/or other controller(s) of the robot 820. In some implementations, the robot 820 may comprise a "brain box" that may include all or aspects of the control system 860. For example, the brain box may provide real time bursts of data to the operational components 804a-n, with each of the real time bursts comprising a set of one or more control commands that dictate, inter alia, the parameters of motion (if any) for each of one or more of the operational components 804a-n. In various implementations, the control commands can be at least selectively generated by the control system 860 based at least in part on selected robot actions and/or other determination(s) made using a machine learning model that is stored locally on the robot 820 and that is trained according to implementations described herein.

Although control system 860 is illustrated in FIG. 8 as an integral part of the robot 820, in some implementations, all or aspects of the control system 860 may be implemented in a component that is separate from, but in communication with, robot 820. For example, all or aspects of control system 860 may be implemented on one or more computing devices that are in wired and/or wireless communication with the robot 820, such as computing device 910 of FIG. 9.

Figure 9:
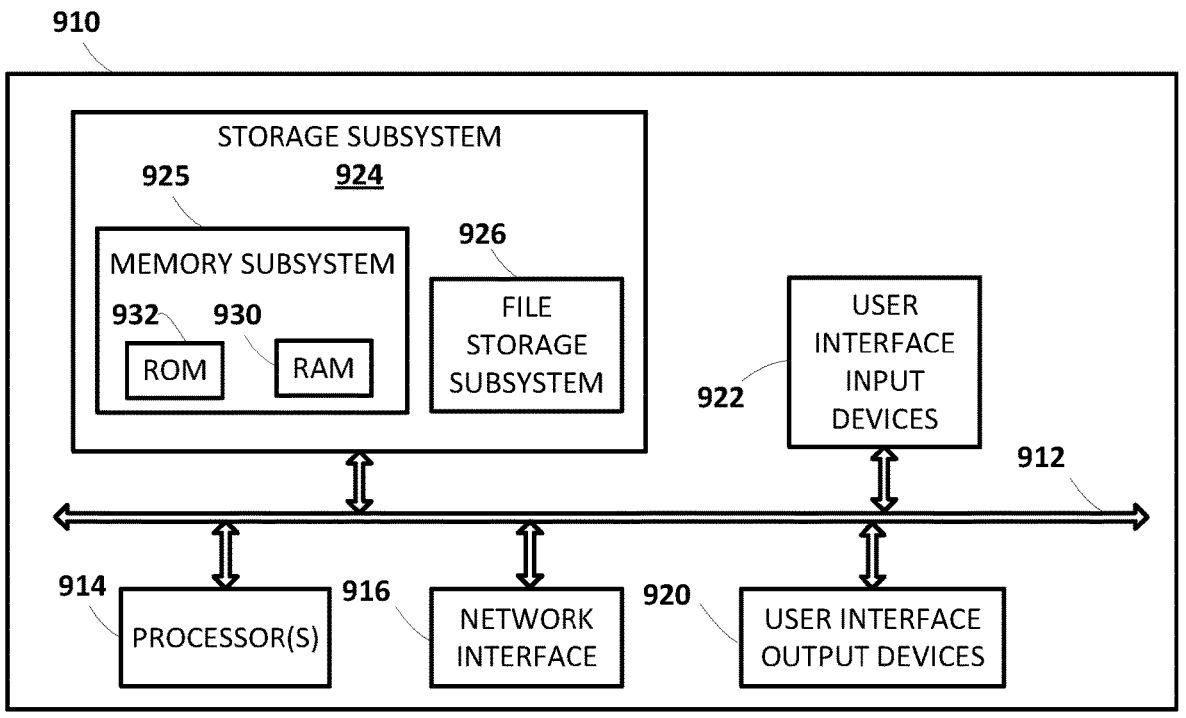
FIG. 9 schematically depicts an example architecture of a computer system, in accordance with various implementations disclosed herein.

Turning now to FIG. 9 is a block diagram of an example computing device 910 that may optionally be utilized to perform one or more aspects of techniques described herein is depicted. Computing device 910 typically includes at least one processor 914 which communicates with a number of peripheral devices via bus subsystem 912. These peripheral devices may include a storage subsystem 924, including, for example, a memory subsystem 925 and a file storage subsystem 926, user interface output devices 920, user interface input devices 922, and a network interface subsystem 916. The input and output devices allow user interaction with computing device 910. Network interface subsystem 916 provides an interface to outside networks and is coupled to corresponding interface devices in other computing devices.

User interface input devices 922 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into computing device 910 or onto a communication network.

User interface output devices 920 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computing device 910 to the user or to another machine or computing device.

Storage subsystem 924 stores programming and data constructs that provide the functionality of some or all of the modules described herein. For example, the storage subsystem 924 may include the logic to perform selected aspects of one or more methods described herein.

These software modules are generally executed by processor 914 alone or in combination with other processors. Memory 925 used in the storage subsystem 924 can include a number of memories including a main random access memory (RAM) 930 for storage of instructions and data during program execution and a read only memory (ROM) 932 in which fixed instructions are stored. A file storage subsystem 926 can provide persistent storage for program and data files, and may include a hard disk drive, a floppy disk drive along with associated removable media, a CD-ROM drive, an optical drive, or removable media cartridges. The modules implementing the functionality of certain implementations may be stored by file storage subsystem 926 in the storage subsystem 924, or in other machines accessible by the processor(s) 914.

Bus subsystem 912 provides a mechanism for letting the various components and subsystems of computing device 910 communicate with each other as intended. Although bus subsystem 912 is shown schematically as a single bus, alternative implementations of the bus subsystem may use multiple busses.

Computing device 910 can be of varying types including a workstation, server, computing cluster, blade server, server farm, or any other data processing system or computing device. Due to the ever-changing nature of computers and networks, the description of computing device 910 depicted in FIG. 9 is intended only as a specific example for purposes of illustrating some implementations. Many other configurations of computing device 910 are possible having more or fewer components than the computing device depicted in FIG. 9.

In some implementations, a method implemented by one or more processors is provided that includes processing a simulated image, using a simulation-to-real generator model, to generate a predicted real image. The simulated image is generated using a simulator. The method further includes processing the predicted real image, using a perception model, to generate predicted output. The perception model is trained based on real training instances, and each of the real training instances include real training instance input that includes a real image, and real training instance output that includes corresponding ground truth output for the real image. The method further includes generating a loss based on comparing the predicted output to ground truth output for the simulated image, and updating the simulation-to-real generator model based on the generated loss.

This method and other implementations of technology disclosed herein may each optionally include one or more of the following features.

In some implementations, the predicted output generated using the perception model includes a predicted bounding area corresponding to an object that is captured in the predicted real image. In some versions of those implementations, comparing the predicted output to the ground truth output includes comparing the predicted bounding area corresponding to the object that is captured in the predicted real image to a ground truth bounding area corresponding to the object captured in the simulated image.

In some further versions of those implementations, the ground truth bounding area is: determined by the simulator when the simulated image is generated, or determined based on applying the simulated image as input across the perception model or an additional perception model after the simulated image is generated.

In some further versions of those implementations, comparing the predicted bounding area to ground truth bounding area includes one or more of: comparing a size of the predicted bounding area to a ground truth size of the ground truth bounding area, comparing a center point of the predicted bounding area to a ground truth center point of the ground truth bounding area, or comparing an orientation of the predicted bounding area to a ground truth orientation of the ground truth bounding area.

In some further versions of those implementations, generating the loss based on comparing the predicted output to the ground truth output includes determining a difference in N-dimensional space between the predicted bounding area and the ground truth bounding area, and generating the loss as a function of the difference in the N-dimensional space between the predicted bounding area and the ground truth bounding area. The N-dimensional space is one or more of: a 1-dimensional space, 2-dimensional space, 2.5-dimensional space, or 3-dimensional space.

In some implementations, the predicted output generated using the perception model includes a predicted probability corresponding to an object classification of an object captured in the predicted real image. In some versions of those implementations, comparing the predicted output to the ground truth output includes comparing the predicted probability corresponding to the object classification of the object captured in the predicted real image to a ground truth probability corresponding to the object captured in the simulated image.

In some further versions of those implementations, the ground truth probability is: determined by the simulator when the simulated image is generated, or determined based on applying the simulated image as input across the perception model or an additional perception model after the simulated image is generated.

In some further versions of those implementations, generating the loss based on comparing the predicted output to the ground truth output includes determining a difference between the predicted probability and the ground truth probability, and generating the loss as a function of the difference between the predicted probability and the ground truth probability.

In some implementations, the predicted output generated using the perception model includes: a predicted bounding area corresponding to an object captured in the predicted real image, and a predicted probability corresponding to an object classification of the object captured in the predicted real image. In some versions of those implementations, generating the loss based on comparing the predicted output to the ground truth output includes comparing the predicted bounding area corresponding to the object captured in the predicted real image to a ground truth bounding area corresponding to the object captured in the simulated image, and comparing the predicted probability corresponding to the object classification of the object captured in the predicted real image to a ground truth probability corresponding to the object captured in the simulated image.

In some further versions of those implementations, generating the loss based on comparing the predicted output to the ground truth output includes generating the loss as a function of: comparing the predicted bounding area to the ground truth bounding area, and comparing the predicted probability to the ground truth probability. In yet further versions of those implementations, the ground truth bounding area and the ground truth bounding area are: determined by the simulator when the simulated image is generated, or determined based on applying the simulated image as input across the perception model or an additional perception model after the simulated image is generated.

In some implementations, the method further includes processing the predicted real image, using a simulation-to-real discriminator model, to determine whether the predicted real image is an actual real image or the predicted real image generated by the simulation-to-real generator model, generating an adversarial loss based on determining whether the predicted real image is the actual real image or the predicted real image, and updating the simulation-to-real generator model is further based on the generated adversarial loss.

In some implementations, the method further includes processing the predicted real image, using a real-to-simulation generator model, to generate a cycled simulated image, processing the cycled simulated image, using the perception model or an additional perception model, to generate further predicted output, and generating the loss is further a function of comparisons between the ground truth output, the predicted output, and the further predicted output. In some versions of those implementations, the method further includes generating a cycle consistency loss based on comparing the simulated image and the cycled simulated image, and updating the simulation-to-real generator model is further based on the generated cycle consistency loss.

In some implementations, the method further includes processing a real image, using a real-to-simulation generator model, to generate a predicted simulated image, wherein the real image is captured using one or more vision components, and processing the predicted simulated image, using an additional perception model, to generate further predicted output. The additional perception model is trained based on simulated training instances, and each of the simulated training instances include simulated training instance input that includes a simulated image, and simulated training instance output that includes corresponding ground truth output for the simulated image. The method further includes generating a further loss based on comparing the further predicted output to further ground truth output for the real image, and updating the simulation-to-real generator model is further based on the generated further loss.

In some further versions of those implementations, the method further includes processing the predicted simulated image, using a real-to-simulation discriminator model, to determine whether the predicted simulated image is an actual simulated image or the predicted simulated image generated by the real-to-simulation generator model, generating a further adversarial loss based on determining whether the predicted simulated image is the actual simulated image or the predicted simulated image, and updating the simulation-to-real generator model is further based on the generated further adversarial loss.

In some further versions of those implementations, the method further includes processing the predicted simulated image, using the simulation-to-real generator model, to generate a cycled real image, generating a further cycle consistency loss based on comparing the real image and the cycled real image, and updating the simulation-to-real generator model is further based on the generated further cycle consistency loss.

In some further versions of those implementations, the further ground truth output is: determined based on one or more labels or annotations assigned to the real image that is captured using one or more of the vision components, or determined based on applying the real image as input across the perception model or the additional perception model.

In some implementations, the method further includes, subsequent to updating the simulation-to-real generator model, generating simulated training data using the updated simulation-to-real generator model. In some versions of those implementations, the method further includes generating a robotic control policy for a real robot using the simulated training data, and causing the real robot to be controlled based on the robotic control policy that is generated using the simulated training data.

In some implementations, the ground truth output is: determined by the simulator when the simulated image is generated, or determined based on applying the simulated image as input across the perception model or an additional perception model after the simulated image is generated.

In some implementations, a method implemented by one or more processors is provided that includes processing a simulated image, using a simulation-to-real generator model, to generate a predicted real image, wherein the simulated image is generated using a simulator, processing the predicted real image, using a real-to-simulator generator model, to generate a cycled simulated image, processing the simulated image, using a perception model, to generate first predicted output, processing the predicted real image, using the perception model or an additional perception model, to generate second predicted output, processing the cycled simulated image, using the perception model or the additional perception model, to generate third predicted output, generating a loss as a function of comparisons of the first predicted output, the second predicted output, and the third predicted output, and updating the simulation-to-real generator model based on the generated loss.

This method and other implementations of technology disclosed herein may each optionally include one or more of the following features.

In some implementations, the first predicted output is ground truth output for the comparisons.

In some implementations, a method implemented by one or more processors is provided that includes training a simulation-to-real generator model. Training the simulation-to-real generator model includes iteratively updating the simulation-to-real generator model based on a perception loss that is generated using a perception model, and, subsequent to training the simulation-to-real generator model, generating a robotic control policy for a real robot based on simulated training data generated using the simulation-to-real generator model, and causing the real robot to be controlled based on the generated robotic control policy.

Other implementations may include a non-transitory computer readable storage medium storing instructions executable by one or more processor(s) (e.g., a central processing unit(s) (CPU(s)), graphics processing unit(s) (GPU(s)), and/ or tensor processing unit(s) (TPU(s))) to perform a method such as one or more of the methods described above and/or elsewhere herein. Yet other implementations may include a system of one or more computers and/or one or more robots that include one or more processors operable to execute stored instructions to perform a method such as one or more of the methods described above and/or elsewhere herein.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

What is claimed is:

1. A method implemented by one or more processors, the method comprising:

processing a simulated image, using a simulation-to-real generator model of a generative adversarial network model, to generate a predicted real image that corresponds to the simulated image, wherein the simulated image is generated using a simulator;

processing the predicted real image, using a real perception model, to generate predicted output for the predicted real image, wherein the real perception model is trained based on real training instances, each of the real training instances comprising: real training instance input that includes a corresponding real image, and real training instance output that includes corresponding ground truth output for the corresponding real image;

generating a perception loss based on comparing the predicted output for the predicted real image that is generated using the real perception model to ground truth output for the simulated image that is generated using the simulator in generating the simulated image;

updating, based on the generated perception loss, the simulation-to-real generator model that was used to generate the predicted real image and based on processing the simulated image; and subsequent to updating the simulation-to-real generator model:

generating a robotic control policy for a real robot based on simulated training data generated using the simulation-to-real generator model; and causing the real robot to be controlled based on the generated robotic control policy.

2. The method of claim 1, wherein the predicted output for the predicted real image that is generated using the real perception model includes a predicted bounding area corresponding to an object that is captured in the predicted real image.

3. The method of claim 2, wherein comparing the predicted output that is generated using the real perception model to the ground truth output for the simulated image that is generated using the simulator in generating the simulated image comprises:

comparing the predicted bounding area corresponding to the object that is captured in the predicted real image to a ground truth bounding area corresponding to the object captured in the simulated image.

4. The method of claim 3, wherein the ground truth bounding area is:

determined by the simulator when the simulated image is generated.

5. The method of claim 3, wherein comparing the predicted bounding area to the ground truth bounding area comprises one or more of:

comparing a size of the predicted bounding area to a ground truth size of the ground truth bounding area, comparing a center point of the predicted bounding area to a ground truth center point of the ground truth bounding area, or comparing an orientation of the predicted bounding area to a ground truth orientation of the ground truth bounding area.

6. The method of claim 3, wherein generating the perception loss based on comparing the predicted output for the predicted real image that is generated using the real perception model to the ground truth output for the simulated image that is generated using the simulator in generating the simulated image comprises:

determining a difference in N-dimensional space between the predicted bounding area and the ground truth bounding area, wherein the N-dimensional space is one or more of: a 1-dimensional space, 2-dimensional space, 2.5-dimensional space, or 3-dimensional space; and generating the perception loss as a function of the difference in the N-dimensional space between the predicted bounding area and the ground truth bounding area.

7. The method of claim 1, wherein the predicted output for the predicted real image that is generated using the real perception model includes a predicted probability corresponding to an object classification of an object captured in the predicted real image.

8. The method of claim 7, wherein comparing the predicted output that is generated using the real perception model to the ground truth output for the simulated image that is generated using the simulator in generating the simulated image comprises:

comparing the predicted probability corresponding to the object classification of the object captured in the predicted real image to a ground truth probability corresponding to the object captured in the simulated image.

9. The method of claim 8, wherein the ground truth probability is:

determined by the simulator when the simulated image is generated.

10. The method of claim 8, wherein generating the perception loss based on comparing the predicted output for the predicted real image that is generated using the real perception model to the ground truth output for the simulated image that is generated using the simulator in generating the simulated image comprises:

determining a difference between the predicted probability and the ground truth probability; and generating the perception loss as a function of the difference between the predicted probability and the ground truth probability.

11. The method of claim 1, wherein the predicted output for the predicted real image that is generated using the real perception model includes: a predicted bounding area corresponding to an object captured in the predicted real image, and a predicted probability corresponding to an object classification of the object captured in the predicted real image.

12. The method of claim 11, wherein generating the perception loss based on comparing the predicted output for the predicted real image that is generated using the real perception model to the ground truth output for the simulated image that is generated using the simulator in generating the simulated image comprises:

comparing the predicted bounding area corresponding to the object captured in the predicted real image to a ground truth bounding area corresponding to the object captured in the simulated image, and comparing the predicted probability corresponding to the object classification of the object captured in the predicted real image to a ground truth probability corresponding to the object captured in the simulated image.

13. The method of claim 12, wherein generating the perception loss based on comparing the predicted output for the predicted real image that is generated using the real perception model to the ground truth output for the simulated image that is generated using the simulator in generating the simulated image further comprises:

generating the perception loss as a function of: comparing the predicted bounding area to the ground truth bounding area, and comparing the predicted probability to the ground truth probability.

14. The method of claim 13, wherein the ground truth bounding area and the ground truth probability are:

determined by the simulator when the simulated image is generated.

15. The method of claim 1, further comprising:

processing the predicted real image, using a simulation-to-real discriminator model of the generative adversarial network model, to determine whether the predicted real image is an actual real image or the predicted real image generated by the simulation-to-real generator model;

generating an adversarial loss based on determining whether the predicted real image is the actual real image or the predicted real image; and wherein updating the simulation-to-real generator model is further based on the generated adversarial loss.

16. The method of claim 1, further comprising:

processing the predicted real image, using a real-to-simulation generator model of the generative adversarial network model or of an additional generative adversarial network model, to generate a cycled simulated image;

processing the cycled simulated image, using the real perception model or a simulated perception model, to generate further predicted output for the cycled simulated image; and wherein generating the perception loss is further a function of comparisons between the ground truth output for the simulated image, the predicted output for the predicted real image, and the further predicted output for the cycled simulated image.

17. The method of claim 16, further comprising:

generating a cycle consistency loss based on comparing the simulated image that is generated using the simulator and the cycled simulated image that is generated using the real-to-simulation generator model of the generative adversarial network model or of the additional generative adversarial network model; and wherein updating the simulation-to-real generator model is further based on the generated cycle consistency loss.

18. The method of claim 1, further comprising:

processing a real image, using a real-to-simulation generator model of the generative adversarial network model or of an additional generative adversarial network model, to generate a predicted simulated image that corresponds to the real image, wherein the real image is captured using one or more vision components;

processing the predicted simulated image, using a simulated perception model, to generate further predicted output for the predicted simulated image, wherein the simulated perception model is trained based on simulated training instances, each of the simulated training instances comprising: simulated training instance input that includes a simulated image, and simulated training instance output that includes corresponding ground truth output for the simulated image;

generating a further perception loss based on comparing the further predicted output that is generated using the simulated perception model to further ground truth output for the real image; and wherein updating the simulation-to-real generator model is further based on the generated further perception loss.

19. A method implemented by one or more processors, the method comprising:

processing a simulated image, using a simulation-to-real generator model of a generative adversarial network model, to generate a predicted real image that corresponds to the simulated image, wherein the simulated image is generated using a simulator;

processing the predicted real image, using a real-to-simulation generator model of the generative adversarial network model, to generate a cycled simulated image that corresponds to the simulated image;

processing the simulated image, using a real perception model, to generate first predicted output for the simulated image;

processing the predicted real image, using the real perception model or a simulated perception model, to generate second predicted output for the predicted real image that corresponds to the simulated image;

processing the cycled simulated image, using the real perception model or the simulated perception model, to generate third predicted output for the cycled simulated image that corresponds to the simulated image;

generating a perception loss as a function of comparisons of the first predicted output for the simulated image, the second predicted output for the predicted real image that corresponds to the simulated image, and the third predicted output for the cycled simulated image that corresponds to the simulated image;

updating, based on the generated perception loss, the simulation-to-real generator model that was used to generate the predicted real image and based on processing the simulated image, the predicted real image that corresponds to the simulated image, and the cycled simulated image that corresponds to the simulated image; and subsequent to updating the simulation-to-real generator model:

generating a robotic control policy for a real robot based on simulated training data generated using the simulation-to-real generator model; and causing the real robot to be controlled based on the generated robotic control policy.

20. A method implemented by one or more processors, the method comprising:

training a simulation-to-real generator model of a generative adversarial network model, wherein training the simulation-to-real generator model comprises:

iteratively updating the simulation-to-real generator model based on a perception loss that is generated using a real perception model, wherein a given iteration, of iteratively updating the simulation-to-real generator model based on the perception loss that is generated using the real perception model, comprises:

processing a given simulated image, using the simulation-to-real generator model, to generate a given predicted real image that corresponds to the given simulated image, wherein the given simulated image is generated using a simulator, processing the given predicted real image, using the real perception model, to generate given predicted output for the given predicted real image, generating the perception loss based on comparing the given predicted output that is generated using the real perception model to given ground truth output for the given simulated image that is generated using the simulator in generating the given simulated image, and updating, based on the generated perception loss, the simulation-to-real generator model that was used to generate the given predicted real image and based on processing the given simulated image; and subsequent to training the simulation-to-real generator model:

generating a robotic control policy for a real robot based on simulated training data generated using the simulation-to-real generator model; and causing the real robot to be controlled based on the generated robotic control policy.

* * * * *